United States Patent
Kumomi et al.

(10) Patent No.: US 7,115,487 B2
(45) Date of Patent: Oct. 3, 2006

(54) CRYSTALLINE THIN FILM AND PROCESS FOR PRODUCTION THEREOF, ELEMENT EMPLOYING CRYSTALLINE THIN FILM, CIRCUIT EMPLOYING ELEMENT, AND DEVICE EMPLOYING ELEMENT OR CIRCUIT

(75) Inventors: Hideya Kumomi, Kanagawa (JP); Hidemasa Mizutani, Kanagawa (JP); Shigeki Kondo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/156,124

(22) Filed: May 29, 2002

(65) Prior Publication Data

US 2003/0003766 A1 Jan. 2, 2003

(30) Foreign Application Priority Data

May 31, 2001 (JP) .............................. 2001-164350
May 23, 2002 (JP) .............................. 2002-148604

(51) Int. Cl.
*H01L 21/205* (2006.01)

(52) U.S. Cl. ..................................... 438/486

(58) Field of Classification Search ................ 438/109, 438/486; 117/8
See application file for complete search history.

(56) References Cited

U.S. PATENT DOCUMENTS

| | | | |
|---|---|---|---|
| 4,564,403 A | 1/1986 | Hayafuji et al. ............. 148/171 |
| 4,800,527 A | 1/1989 | Ozaki et al. .................. 365/182 |
| 4,983,539 A | 1/1991 | Yamagata et al. ........... 437/110 |
| 4,999,313 A | 3/1991 | Arikawa et al. .............. 437/84 |
| 5,008,206 A | 4/1991 | Shinohara et al. ............. 437/3 |
| 5,010,033 A | 4/1991 | Tokunaga et al. ............. 437/83 |
| 5,013,670 A | 5/1991 | Arikawa et al. ................ 437/2 |
| 5,028,976 A | 7/1991 | Ozaki et al. .................. 357/42 |
| 5,043,785 A | 8/1991 | Mizutani et al. .............. 357/30 |
| 5,070,034 A | 12/1991 | Satoh et al. ................... 437/52 |
| 5,072,116 A | 12/1991 | Kawade et al. ............. 250/306 |
| 5,086,326 A | 2/1992 | Shinohara et al. ............ 357/30 |
| 5,087,296 A | 2/1992 | Kondo et al. ................ 136/258 |
| 5,094,697 A | 3/1992 | Takabayashi et al. ....... 136/249 |
| 5,098,850 A | 3/1992 | Nishida et al. ................. 437/4 |
| 5,100,691 A | 3/1992 | Tokunaga et al. ............. 427/38 |
| 5,118,365 A | 6/1992 | Tokunaga et al. ............. 148/33 |
| 5,130,103 A * | 7/1992 | Yamagata et al. .......... 428/209 |

(Continued)

FOREIGN PATENT DOCUMENTS

EP    1 097 982    5/2001

(Continued)

OTHER PUBLICATIONS

Williamson et al., "Properties of amorphous hydrogenated silicon-tin alloys prepared by radio frequency sputtering", Jounral of Applied Physics, vol. 55, No. 8, Apr. 15, 1984 pp. 2816-2824.*

(Continued)

*Primary Examiner*—W. David Coleman
(74) *Attorney, Agent, or Firm*—Fitzpatrick, Cella, Harper & Scinto

(57) ABSTRACT

A process for producing a crystalline thin film is provided which comprises melting and resolidifying a starting thin film having regions different in the state coexisting continuously. A small region of the starting thin film has a size distribution of number concentration of crystal grains or crystalline clusters different from that of the surrounding region. In the process of melting and resolidification, the crystal grain grows preferentially in the one region to control the location of the crystal grain in the crystalline thin film.

31 Claims, 11 Drawing Sheets

U.S. PATENT DOCUMENTS

| | | | |
|---|---|---|---|
| 5,130,778 A | 7/1992 | Arikawa et al. | 357/54 |
| 5,155,058 A | 10/1992 | Fujiwara et al. | 437/52 |
| 5,176,557 A | 1/1993 | Okunuki et al. | 445/24 |
| 5,190,613 A | 3/1993 | Yamagata | 156/600 |
| 5,201,681 A | 4/1993 | Okunuki et al. | 445/24 |
| 5,207,863 A * | 5/1993 | Kumomi | 428/450 |
| 5,219,769 A | 6/1993 | Yonehara et al. | 437/35 |
| 5,236,544 A | 8/1993 | Yamagata | 156/603 |
| 5,236,546 A | 8/1993 | Mizutani | 156/620.71 |
| 5,243,200 A | 9/1993 | Kawasaki et al. | 257/99 |
| 5,250,819 A | 10/1993 | Kawasaki et al. | 257/88 |
| 5,254,211 A | 10/1993 | Yonehara | 156/621 |
| 5,255,258 A | 10/1993 | Kawade et al. | 369/126 |
| 5,269,876 A | 12/1993 | Mizutani | 156/612 |
| 5,278,092 A | 1/1994 | Sato | 437/90 |
| 5,281,283 A | 1/1994 | Tokunaga et al. | 148/33.2 |
| 5,290,712 A * | 3/1994 | Sato et al. | 438/798 |
| 5,296,087 A | 3/1994 | Tokunaga | 156/611 |
| 5,304,820 A | 4/1994 | Tokunaga et al. | 257/88 |
| 5,318,661 A * | 6/1994 | Kumomi | 117/8 |
| 5,320,907 A | 6/1994 | Sato | 428/446 |
| 5,324,536 A | 6/1994 | Yonehara | 427/99 |
| 5,334,864 A | 8/1994 | Tokunaga et al. | 257/78 |
| 5,361,015 A | 11/1994 | Okunuki et al. | 313/309 |
| 5,363,793 A | 11/1994 | Sato | 117/2 |
| 5,363,799 A | 11/1994 | Yonehara et al. | 117/94 |
| 5,369,290 A | 11/1994 | Kawasaki et al. | 257/103 |
| 5,373,803 A | 12/1994 | Noguchi et al. | 117/8 |
| 5,393,646 A | 2/1995 | Yonehara | 430/313 |
| 5,423,286 A | 6/1995 | Yonehara | 117/94 |
| 5,425,808 A | 6/1995 | Tokunaga et al. | 117/95 |
| 5,447,117 A | 9/1995 | Yonehara et al. | 117/7 |
| 5,463,975 A | 11/1995 | Yonehara | 117/9 |
| 5,471,944 A | 12/1995 | Sato | 117/84 |
| 5,482,002 A | 1/1996 | Kawade et al. | 117/90 |
| 5,496,768 A | 3/1996 | Kudo | 437/174 |
| 5,529,951 A | 6/1996 | Noguchi et al. | 437/174 |
| 5,531,182 A | 7/1996 | Yonehara | 117/7 |
| 5,541,523 A | 7/1996 | Tourville et al. | 324/711 |
| 5,548,131 A | 8/1996 | Tokunaga et al. | 257/64 |
| 5,571,747 A | 11/1996 | Koizumi et al. | 437/81 |
| 5,572,044 A | 11/1996 | Koizumi et al. | 257/49 |
| 5,580,381 A | 12/1996 | Yamagata | 117/101 |
| 5,582,641 A | 12/1996 | Sato | 117/97 |
| 5,602,057 A | 2/1997 | Kawasaki et al. | 437/203 |
| 5,610,094 A | 3/1997 | Ozaki et al. | 437/62 |
| 5,632,812 A | 5/1997 | Hirabayashi | 117/94 |
| 5,653,802 A | 8/1997 | Yamagata | 117/9 |
| 5,659,184 A | 8/1997 | Tokunaga et al. | 257/91 |
| 5,663,579 A | 9/1997 | Noguchi | 257/75 |
| 5,690,736 A | 11/1997 | Tokunaga | 117/86 |
| 5,718,761 A | 2/1998 | Tokunaga et al. | 117/94 |
| 5,733,369 A | 3/1998 | Yonehara et al. | 117/89 |
| 5,807,432 A | 9/1998 | Hirabayashi | 117/87 |
| 5,853,478 A | 12/1998 | Yonehara et al. | 117/89 |
| 5,869,803 A | 2/1999 | Noguchi et al. | 219/121.62 |
| 5,970,361 A * | 10/1999 | Kumomi et al. | 438/409 |
| 5,994,698 A | 11/1999 | Kawade et al. | 250/306 |
| 6,071,765 A | 6/2000 | Noguchi et al. | 438/166 |
| 6,080,239 A | 6/2000 | Noguchi | 117/92 |
| 6,316,338 B1 | 11/2001 | Jung | 438/487 |
| 6,322,625 B1 | 11/2001 | Im | 117/43 |
| 6,326,286 B1 * | 12/2001 | Park et al. | 438/478 |
| 6,368,945 B1 | 4/2002 | Im | 438/487 |
| 6,417,031 B1 * | 7/2002 | Ohtani et al. | 438/151 |
| 6,555,449 B1 | 4/2003 | Im et al. | 438/487 |
| 2001/0041426 A1 | 11/2001 | Im | 438/479 |
| 2002/0031876 A1 | 3/2002 | Hara et al. | 438/166 |
| 2003/0017659 A1 | 1/2003 | Takei et al. | 438/166 |
| 2003/0027410 A1 | 2/2003 | Matsumura et al. | 438/487 |
| 2003/0034523 A1 | 2/2003 | Hiroshima | 257/347 |
| 2003/0042486 A1 | 3/2003 | Sano et al. | 257/49 |
| 2003/0089907 A1 | 5/2003 | Yamaguchi et al. | 257/57 |
| 2003/0094585 A1 | 5/2003 | Hara et al. | 250/492.23 |
| 2003/0104662 A1 | 6/2003 | Hatano et al. | 438/166 |
| 2003/0104682 A1 | 6/2003 | Hara et al. | 438/487 |
| 2003/0109074 A1 | 6/2003 | Shiba et al. | 438/22 |
| 2003/0152764 A1 * | 8/2003 | Bunyan et al. | 428/328 |
| 2003/0160263 A1 | 8/2003 | Hiroshima | 257/151 |

FOREIGN PATENT DOCUMENTS

| | | |
|---|---|---|
| GB | 2 338 342 | 12/1999 |
| GB | 2338342 A | 12/1999 |
| JP | 5-102035 | 4/1993 |
| KR | 1996-0001849 | 1/1996 |
| KR | 1996-0029860 | 8/1996 |
| KR | 10-0327087 | 1/2001 |

OTHER PUBLICATIONS

B. Sapaev et al., "Investigation of the Growth and Properties of Epitaxial Layersd of $Si_{1-x}-Sn_x$ Solid Solutions"Technical Physics Letters. vol. 29, No. 11, 2003 pp. 963-965.*

H. Kumomi, et al., "Fundamentals for the Formation and Structure Control of Thin Films: Nucleation, Growth, Solid-State Transformations", Handbook of Thin Film Materials, Academic Press, New York, vol. 1, chapter 6, pp. 319-373 (2002).

D. Toet, et al., "Laser Induced Nucleation and Growth of Polycrystalline Silicon", J. N n-Cryst. Solids, vol. 198-200, pp. 887-890 (1996).

D. Toet, et al., "Large Area Polycrystalline Silicon Thin Films Grown by Laser-Induced Nucleation and Solid Phase Crystallization", Thin Solid Films, vol. 296, pp. 49-52 (1997).

D. Toet, et al., "Growth of Polycrystalline Silicon on Glass by Selective Laser-Induced Nucleation", Appl. Phys. Lett., vol. 69, No. 24, pp. 3719-3721 (1996).

H. Kuriyama, et al., "Lateral Grain Growth of Poly-Si Films with a Specific Orientation by an Excimer Laser Annealing Method", Jpn. J. Appl. Phys., vol. 32, pp. 6190-6195 (1993).

T. Sameshima, "Self-Organized Grain Growth Larger than 1 µm through Pulsed-Laser-Induced Melting of Silicon Films", Jpn. J. Appl. Phys., vol. 32, pp. L1485-L1488 (1993).

D. Choi, et al., "Drastic Enlargement of Grain Size of Excimer-Laser-Crystallized Polysilicon Films", Jpn. J. Appl. Phys., vol. 31, pp. 4545-4549 (1992).

H. Kumomi, et al., "Selective Nucleation-Based Epitaxy (SENTAXY): A Novel Approach for Thin Film Formation", Jpn. J. Appl. Phys., vol. 36, pp. 1383-1388 (1997).

H.J. Song, et al., "Single-Crystal Si Islands on $SIO_2$ Obtained via Excimer-Laser Irradiation of a Patterned Si Film", Appl. Phys. Lett., vol. 68, No. 22, pp. 3165-3167 (1996).

H.J. Kim, et al., "New excimer-Laser-Crystallization Method for Producing Large-Grained and Grain Boundary-Location-Controlled Si Films for Thin Film Transistors", Appl. Phys. Lett., vol. 68, No. 11, pp. 1513-1515 (1996).

J.S. Im, et al., "Phase Transformation Mechanisms Involved in Excimer Laser Crystallization of Amorphous Silicon Films", Appl. Phys. Lett., vol. 63, No. 14, pp. 1969-1971 (1993).

R. Ishihara, et al., "Location Control of Crystal Si Grain Followed by Excimer-Laser M lting of Si Thin-Films", Jpn. J. Appl. Phys., vol. 37, pp. L15-L17 (1998).

P.C. Van der Wilt, et al., "Grain Location Control in Excimer-Laser Crystallization of Thin Silicon Films", Phys. Stat. Sol., vol. 166, pp. 619-627 (1998).

V.V. Gupta, et al., "Non-Equilibrium Two-Dimensional Model of Excimer-Laser Melting and Solidification of Thin Si Films on $SIO_2$", Mat. Res. Soc. Symp. Proc., vol. 397, pp. 465-470 (1996).

K. Kobashi, et al., "Selected-area deposition of diamond films", Vacuum, vol. 41, No. 4-6, 1990, pp. 1383-1386.

R. Ramesham, et al., "Selective and low temperature synthesis of polycrystalline diamond", J. Mater. Res., vol. 6, No. 6, Jun. 1991, pp. 1278-1286.

S. Miyauchi, et al., "Microfabrication of diamond films; selective deposition and etching", Surface and Coatings Technology, 47, 1991, pp. 465-473.

S. Katsumata, et al., "New method for selective growth of diamonds by microwave plasma chemical vapour deposition", Diamond and Related Materials, 2, 1993, pp. 1490-1492.

P.G. Roberts, et al., "The selective area deposition of diamond films", J. Mater. Res., vol. 11, No. 12, Dec. 1996, pp. 3128-3132.

T. Noma, et al. "Crystal forms by solid-state recrystallization of amorphous Si films on $SiO_2$" Appl. Phys. Lett. vol. 59(6), pp. 653-655 (1991).

H. Kumomi, et al. "Direct measurement of the free-energy barrier to nucleation from the size distribution of dendritic crystallites in a-Si thin films" Phys. Rev. B vol. 52(23), pp. 16753-16761 (1995).

H. Kumomi, et al., "Manipulation of Nucleation Sites in Solid-State Crystallization of Amorphous Si Films" Mat. Res. Soc. Symp. Proc. vol. 202, pp. 645-650 (1991).

H. Kumomi, et al., "Manipulation of nucleation sites in solid-state Si crystallization" Appl. Phys. Lett. vol. 59(27), pp. 3565-3567 (1991).

H. Kumomi "Location control of crystal grains in excimer laser crystallization of silicon thin films" Appl. Phys. Lett. vol. 83(3), pp. 434-436 (2003).

Applied Physics Letters, Reviewer's Report, MS. #L03-1236.

H. Komomi, et al. "Fundamentals for the formation and structure control of thin films: nucleation, growth, solid-state transformations" Handbook of Thin Film Materials, vol. 1, Ch. 6, pp. 319-373 (2001).

T. Yonehara, et al. "Manipulation of nucleation sites and periods over amorphous substrates" Appl. Phys. Lett. vol. 52(15), pp. 1231-1233 (1988).

K. Hirabayashi, et al. "Selective deposition of diamond crystals by chemical vapor deposition using a tungsten-filament method" Appl. Phys. Lett. vol. 53(19), pp. 1815-1817 (1988).

N. Sato, et al. "Manipulation of Si nucleation on artificial sites on $SiN_x$ (X<4/3) over $SiO_2$" Appl. Phys. Lett. vol. 55(7), pp. 636-638 (1989).

Jing-sheng Ma, et al. "Interfacial structures and selective growth of diamond particles formed by plasma-assisted CVD" Appl. Surf. Sci. vol. 41-42, pp. 572-579 (1989).

Jing Sheng Ma, et al. "Selective nucleation and growth of diamond particles by plasma-assisted chemical vapor deposition" Appl. Phys. Lett. vol. 55(11), pp. 1071-1073 (1989).

Jing Sheng Ma, et al., "Nucleation control and selective growth of diamond particles formed with plasma CVD" J. Cryst. Growth, vol. 99, pp. 1206-1210 (1990).

T. Inoue, et al. "Selected-area deposition of diamond films" J. Appl. Phys. vol. 67(12), pp. 7329-7336 (1990).

J. F. DeNatale, et al. "Microstructural control of diamond thin films by microlithographic patterning" J. Appl. Phys. vol. 68(8), pp. 4014-4019 (1990).

Jing Sheng Ma, et al. "Large area diamond selective nucleation based epitaxy" Thin Solid Films, 206, pp. 192-197 (1991).

S. J. Lin, et al. "Effects of local facet and lattice damage on nucleation of diamond grown by microwave plasma chemical vapor deposition" Appl. Phys. Lett. vol. 60(13), pp. 1559-1561 (1991).

H. Tokunaga, et al. "Polycrystalline GaAs Made by Selective Deposition and Its Optical Properties" Jpn. J. Appl. Phys. vol. 31, pp. L1710-L1713 (1992).

J. Aizenberg, et al. "Control of crystal nucleation by patterned self-assembled monolayers" Nature vol. 398, pp. 495-498 (1999).

K. Yamagata, et al. "Selective growth of Si crystals from the agglomerated Si seeds over amorphous substrates" Appl. Phys. Lett. vol. 61(21), pp. 2557-2559 (1992).

H. Kumomi, et al. "Transient nucleation and manipulation of nucleation sites in solid-state crystallization of α-Si films" J. Appl. Phys. vol. 75(6), pp. 2884-2901 (1994).

T. Asano, et al. "Control of Si Solid Phase Nucleation by Surface Steps for High-Performance Thin-Film Transistors" Jpn. J. Appl. Phys. vol. 32, pp. 482-485 (1993).

T. Asano, et al. "Characteristics of Thin-Film Transistors Fabricated on Nucleation-Controlled Poly-Si Films by Surface Steps" Jpn. J. Appl. Phys. vol. 33, pp. 659-663 (1994).

H. A. Atwater, et al., "Synthesis of Large-Grained Poly-Ge Templates by Selective Nucleation and Solid Phase Epitaxy for GaAs Solar Cels on Soda-Lime Glass" AIP Conf. Proc. vol. 404, pp. 345-353 (1997).

K. Makihira, et al. "Enhanced nucleation in solid-phase crystallization of amorphous Si by imprint technology", Appl. Phys. Lett. vol. 76(25), pp. 3774-3776 (2000).

T. Noguchi, et al. "Proceedings of Sony Research Forum" pp. 200-206 (1992).

D. Toet, et al. "Growth of polycrystalline silicon on glass by selective laser-induced nucleation" Appl. Phys. Lett. vol. 69(24), pp. 3719-3721 (1996).

R. S. Sposili, et al. "Sequential lateral solidification of thin silicon films on $SiO_2$" Appl. Phys. Lett. vol. 69(19), pp. 2864-2866 (1996).

James S. Im, et al. "Single-crystal Si films for thin-film transistor devices" Appl. Phys. Lett. vol. 70(25), pp. 3434-3436 (1997).

K. Ishikawa, et al. "Excimer-Laser-Induced Lateral-Growth of Silicon Thin-Films" Jpn. J. Appl. Phys. vol. 37, pp. 731-736 (1998).

Chang-Ho Oh, et al. A Novel Phase-Modulated Excimer-Laster Crystallization Method of Silicon Thin Films Jpn. J. Appl. Phys. vol. 37, pp. L492-L495 (1998).

L. Mariucci, et al. "A Two-Pass Excimer Laser Annealing Process to Control Amorphous Silicon Crystallization" Jpn. J. Appl. Phys. vol. 38, pp. L907-L910 (1999).

B. Rezek, et al. "Polycrystalline Silicon Thin Films Produced by Interference Laser Crystallization of Amorphous Silicon" Jpn. J. Appl. Phys. vol. 38, L1083-L1084 (1999).

S. Horita, et al. "Alignment of grain boundary in a Si film crystallized by a linearly polarized laser beam on a glass substrate" Appl. Phys. Lett. vol. 78(15), pp. 2250-2252 (2001).

Wen-Chang Yeh, et al. "Effects of a Low-Melting-Point Underlayer on Excimer-Laser-Induced Lateral Crystallization of Si Thin-Films", Jpn. J. Appl. Phys. vol. 40, pp. 3096-3100 (2001).

B. Rezek, et al. "Laser beam induced currents in polycrystalline silicon thin films prepared by interference laser crystallization" J. Appl. Phys. vol. 91(7), pp. 4220-4228 (2002).

A. Hara, et al. "High-Performance Polycrystalline Silicon Thin Film Transistors on Non-Alkali Glass Produced Using Continuous Wave Laser Lateral Crystallization" Jpn. J. Appl. Phys. vol. 41, pp. L311-L313 (2002).

M. Hatano et al. "12.4L: Late-News Paper: Selectively Enlarging Laser Crystallization Technology for High and Uniform Performance Poly-Si TFTs" SID 02 DIGEST, pp. 158-161 (2002).

A. Hara, et al. "Selective Single-Crystalline-Silicon Growth at the Pre-defined Active Region of a Thin Film Transistor on Glass by Using Continuous Wave Laser Irradiation" Jpn. J. Appl. Phys. vol. 42 pp. 23-27 (2003).

Chang-Ho Oh, et al. "Preparation of Position-Controlled Crystal-Silicon Island Arrays by Means of Excimer-Laser Annealing" Jpn. J. Appl. Phys. vol. 37, pp. 5474-5479 (1998).

M. Ozawa, et al. "Two-Dimensionally Position-Controlled Excimer-Laser-Crystallization of Silicon Thin Films on Glassy Substrate" Jpn. J. Appl. Phys. vol. 38, pp. 5700-5705 (1999).

M. Nakata, et al. "A New Nucleation-Site-Control Excimer-Laser-Crystallization Meth d" Jpn. J. Appl. Phys. vol. 40, pp. 3049-3054 (2001).

R. Ishibara, et al. "Location Control of Large Grain Following Excimer-Laser Melting of Si Thin-Films" Jpn. J. Appl. Phys. vol. 37, pp. 1071-1075 (1998).

R. Ishibara, et al. "Location-Control of large Si Grains by Dual-Beam Excimer-Laser and Thick Oxide Portion" Jpn. J. Appl. Phys. vol. 39, pp. 3872-3878 (2000).

A. Hara, et al. "Control of Nucleation and Solidification Direction of Polycrystalline Silicon by Excimer Laser Irradiation" Jpn. J. Appl. Phys. vol. 39, pp. L1-L4 (2000).

A. Hara, et al. "Use of necked-down areas to control nucleation site and direction of solidification of polycrystalline silicon using excimer laser crystallization" J. Appl. Phys. vol. 88(6), pp. 3349-3353 (2000).

P. Ch. van der Wilt, et al. "Formation of location-controlled crystalline islands using substrate-embedded seeds in excimer-laser crystallization of silicon films" Appl. Phys. Lett. vol. 79(12), pp. 1819-1821 (2001).

S. Yoshimoto, et al. "A New Sample Structure for Position-Controlled Giant-Grain Growth of Silicon using Phase-Modulated Excimer-Laser Annealing " Jpn. J. Appl. Phys. vol. 40, pp. 4466-4469 (2001).

H. Kuriyama, et al., "Lateral Grain Growth in the Excimer Laser Crystallization of Poly-Si", Mater. Res. Soc. Symp. Proc., vol. 321, pp. 657-662 (1994).

H. Kuriyama, et al., "Comprehensive Study of Lateral Grain Growth in Poly-Si Films by Excimer Laser Annealing and Its Application to Thin Film Transistors", Jpn. J. Appl. Phys., vol. 33, No. 10, pp. 5657-5662 (1994).

M. Lee, et al., "Relationship between Fluence Gradient and Lateral Grain Growth in Spatially Controlled Excimer Laser Crystallization of Amorphous Silicon Films", J. Appl. Phys., vol. 88, No. 9, pp. 4994-4999 (2000).

* cited by examiner

CRYSTALLINE THIN FILM AND PROCESS FOR PRODUCTION THEREOF, ELEMENT EMPLOYING CRYSTALLINE THIN FILM, CIRCUIT EMPLOYING ELEMENT, AND DEVICE EMPLOYING ELEMENT OR CIRCUIT

BACKGROUND OF THE INVENTION

1. Field of the Invention

The present invention relates to a crystalline thin film and a process for production thereof, an element employing the crystalline thin film, a circuit employing the element, and a device employing the element or the circuit, which are useful for large-scale integrated circuits requiring high spatial uniformity such as flat panel displays, image sensors, magnetic recording devices, and information/signal processors.

2. Related Background Art

Flat panel displays such as liquid crystal displays have been improved in fineness, display speed, and gradation of image display by monolithic implementation of an image driving circuit to the panel. The simple matrix-driven panels have been replaced with active matrix-driven panels having a switching transistor for each pixel. At present, ultra-fine full-color liquid crystal displays are provided to be suitable for moving pictures by implementing a shift resistor circuit on the periphery of the same panel for driving the active matrix.

The monolithic implementation including the peripheral driving circuit can be produced at a practical production cost mainly owing to development of the technique for forming a polycrystal silicon thin film having excellent electrical performance on an inexpensive glass substrate: the technique in which amorphous silicon thin film deposited on a glass substrate is melted and resolidified by a short-time pulse projection of light of ultraviolet region such as an excimer laser by keeping the glass substrate at a low temperature. The crystal grain obtained by melting-resolidification has a low defect density in the grain in comparison with crystal grains obtained from the same amorphous silicon thin film by solid-phase crystallization into a polycrystalline thin film. Thereby, the thin film transistor constituted by using this thin film as the active region exhibits a high carrier mobility. Therefore, even with the polycrystalline thin film having an average grain size up to a submicron, an active matrix-driven monolithic circuit can be produced which exhibits sufficient performance in a liquid display having a fineness of 100 ppi or lower in diagonal display size of several inches.

However, it has become clear that the current thin film transistor employing the polycrystalline silicon thin film produced by melting-resolidification is still insufficient in performance for a liquid-crystal display of the next generation having a larger screen or a higher fineness. Furthermore, the aforementioned polycrystalline silicon thin film insufficiently performs as the driving circuit element in promising future application fields of plasma displays and electroluminescence displays driven at a higher voltage, or larger electric current than the liquid crystal display, or in the application fields of a medical large-screen X-ray image sensor. The polycrystalline silicon thin film, which has average grain size up to submicron, cannot give a high-performance element even with the low defect density in the grain, because of many grain boundaries which hinder charge transfer in the active region of the element having a size of about a micron.

For decreasing the grain boundary density, it is very effective to enlarge the average crystal grain size, which is inversely proportional to the grain boundary density. Also, in short-time melting-resolidification of the amorphous silicon thin film, several methods are disclosed to enlarge the average grain size up to a micron or larger. However, by the disclosed methods, while the average grain size is enlarged, the grain size distribution is broadened [e.g., J. S. Im, H. J. Kim, M. O. Thompson, Appl. Phys. Lett. 63, 1969 (1993); H. Kuriyama, T. Honda, S. Ishida, T. Kuwahara, S. Noguchi, S. Kiyama, S. Tsuda, and S. Nakano, Jpn. Appl. Phys. 32, 6190 (1993)]; and the spatial location of the grain boundaries is not controlled [e.g., T. Sameshima, Jpn. J. Appl. Phys. 32, L1485 (1993); H. J. Kim and J. S. Im, Appl. Phys. Lett. 68, 1513 (1996)]. Thereby, the increase of the average grain size will increase variation of the grain boundary density among the active regions of the element to result in an increase of variation of element performance. Otherwise, the method itself is extremely tricky to be not suitable for practical production [e.g., D. H. Choi, K. Shimizu, O. Sugiura, and M. Matsumura, Jpn. J. Appl. Phys. 31, 4545 (1992); and H. J. Song, and J. S. Im, Appl. Phys. Lett. 68, 3165 (1996)].

Regarding these problems, no idea is given for solving the latter problem, but a methodology has been developed for solving the former problem, in which the location of the grain boundaries and grain size distribution are controlled by controlling the location of formation of crystal grains. This is demonstrated in chemical vapor deposition of polycrystalline thin films and solid-phase crystallization of thin films (see e.g., H. Kumomi and T. Yonehara, Jpn. J. Appl. Phys. 36, 1383 (1997); and H. Kumomi and F. G. Shi, "Handbook of Thin Films Materials", volume 1, chapter 6, "Fundamentals for the formation and structure control of thin films: Nucleation, Growth, Solid-State Transformations" edited by H. S. Nalwa (Academic Press, New York, 2001)).

Several attempts are reported to realize the above idea in formation of a crystalline thin film by melting-resolidification. Noguchi [Japanese Patent Application Laid-Open No. 5-102035], and Ikeda [T. Noguchi and Y. Ikeda: Proc. Sony Research Forum, 200 (Sony Corp., Tokyo, 1993)], in melting-resolidification of amorphous silicon thin film by excimer-laser annealing, prepare openings through a light-intercepting layer provided on an amorphous silicon thin film and project an excimer laser beam to the amorphous silicon thin film. Thereby, the amorphous silicon at the opening portions is selectively melted and resolidified to form preferential crystallization region in the thin film plane. Toet et al. [D. Toet, P. V. Santos, D. Eitel, and M. Heintze, J. Non-Cryst. Solids 198/200, 887 (1996); D. Toet, B. Koopmans, P. V. Santos, R. B. Bergmann, and B. Richards, Appl. Phys. Lett. 69, 3719 (1996); and D. Toet, B. Koopmans, R. B. Bergmann, B. Richard, P. V. Santos, M. Arbrecht, and J. Krinke, Thin Solid Films 296, 49 (1997)] project an Ar laser beam focused to about 1 μm onto an amorphous silicon thin film to cause melting and resolidification only in the irradiated regions.

However, in the above methods, many crystal grains are formed in the crystallization regions at random positions of the grains in the region, and the number of crystal grains formed in the regions varied greatly among the regions.

Ishihara and Wilt [R. Ishihara and P. Ch. van der Wilt, J. Appl. Phys. 37, L15 (1998); and P. Ch. van der Wilt and R. Ishihara, Phys. Stat Sol. (A)166, 619 (1998)] report a method of melting-resolidification of an amorphous silicon thin film by excimer-laser annealing on a single-crystalline silicon substrate covered with an oxide layer, in which method an oxide film is deposited on a single crystalline silicon substrate having hillocks and the deposited oxide film is flattened. Thereby, the underlying oxide layer is made thinner locally on the top of the hillocks and heat is transferred more rapidly from the thinner portion of the molten silicon film to the substrate to cause rapid cooling.

Therefore, the solidification is initiated preferentially from the hillock portions to cause growth of the crystal grain. Ishihara et al. mention the possibility of growing a single crystal grain on the hillocks by optimizing the projected area of the hillocks and the oxide film thickness. However, the possibility has not been confirmed, and the window for the optimum conditions is very small. Moreover this method employs a highly heat-conductive underlying substrate, and is not applicable to a method employing a glass substrate. Furthermore, the fine working of the underlying substrate and the flattening of the oxide film over a large area is not easy and is not practicable.

As described above, in the formation of crystalline thin film by melting-resolidification, the location of the crystal grain formation cannot readily be controlled. However, this method is promising for improving the properties of the thin film, since the thin crystalline film formed by the melting-resolification method has defects in a low density in the crystal grain in comparison with the films prepared by other thin film formation methods.

The present invention intends to provide a process for producing a general-purpose crystalline thin film applicable to glass substrate or the like by melting-resolidification, in which the location of the crystal grains can precisely be controlled. The present invention intends to provide also a thin film in which the location of the crystal grains can be precisely controlled. The present invention intends further to provide a high-performance element and circuit, and to provide a device by employing the thin film.

SUMMARY OF THE INVENTION

An embodiment of the present invention is a process for producing a crystalline thin film, which comprises melting and resolidifying a starting thin film having regions different in a state thereof from each other coexisting continuously. In particular, in the process for producing a crystalline thin film, the starting thin film has a small region in a state different from a surrounding region, and a prescribed number of crystal grains or crystalline clusters are grown in the small region.

In the above process for producing a crystalline thin film of the present invention, the starting thin film contains a crystal grain or a crystalline cluster, and the state difference between the regions is characterized by size distribution of number concentration of crystal grains or crystalline clusters remaining unmelted in the step of melting and resolidifying the starting thin film. In this embodiment, the constitutions below are preferred.

The aforementioned state difference between the regions is characterized by a melting point of the bulk portion or surface of the crystal grain or crystalline cluster, or a boundary between adjacent crystal grains or crystalline clusters.

The aforementioned starting thin film contains an amorphous portion, and the state difference between the regions is characterized by a melting point of the bulk portion or surface of the crystal grain or crystalline cluster, a boundary between adjacent crystal grains or crystalline clusters, or the amorphous portion.

The aforementioned starting thin film is an amorphous thin film containing a crystal grain or a crystalline cluster, and the state different between the regions is characterized by size distribution of number concentration of the crystal grains or crystalline clusters contained in the amorphous matrix of the starting thin film.

The aforementioned starting thin film is a polycrystalline thin film, and the state difference between the regions is characterized by size distribution of number concentration of the crystal grains or crystalline clusters constituting the starting thin film.

The aforementioned starting thin film contains an amorphous region and a polycrystalline region in coexistence, and the state difference between the amorphous region and the polycrystalline region is characterized by crystallinity.

The aforementioned starting thin film is an amorphous thin film, and the state difference between the regions is characterized by the height of free-energy barriers to nucleation of crystallite in solid-phase crystallization before the maximum melting moment in the melting and resolidification of the starting thin film. In particular, the height of free-energy barriers to nucleation of crystallite is controlled by any of an element composition ratio, a contained impurity concentration, a surface adsorbate, and a state of the interface between the starting thin film and the substrate.

In the process for producing a crystalline thin film of the present invention, the state difference between the regions is characterized by a height of free-energy barrier to nucleation of crystallite in solidification from a molten phase. In particular, the height of free-energy barriers to nucleation of crystallite is controlled by any of an element composition ratio, a contained impurity concentration, a surface adsorbate, and a state of the interface between the starting thin film and the substrate.

In the process for producing a crystalline thin film of the present invention, the spatial location of at least a part of crystal grains with a continuous crystal structure is controlled by controlling the spatial location of the regions different in the states in the starting thin film.

A second embodiment of the present invention is a crystalline thin film, produced by the process for producing a crystalline thin film as described above.

A third embodiment of the present invention is an element employing the crystalline thin film of the present invention. Preferably, the spatial location of at least a part of the crystal grains with a continuous crystal structure is controlled by controlling the spatial location of the regions having different states in the starting thin film, and the crystal grains having the controlled location are employed as active regions. More preferably, the active region is formed inside the one single crystal grain in the crystalline thin film.

A fourth embodiment of the present invention is a circuit including the above elements of the present invention. A fifth embodiment of the present invention is a device employing the element or the circuit of the present invention.

DESCRIPTION OF THE PREFERRED EMBODIMENTS

Figure 1A:
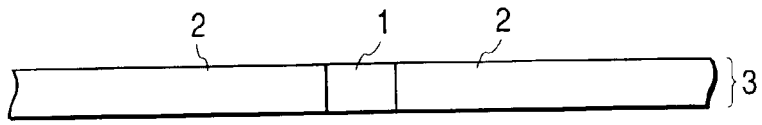
FIGS. 1A, 1B, 1C, 1D, 1E, 1F, 1G and 1H show a first basic embodiment of a crystalline thin film and a production process of the present invention.

A first problem to be solved by the present invention is precise control of location of crystal grain formation in melting-resolidification of thin films. In conventional methods as described above, the location is controlled by preferential resolidification by causing thermal distribution in the molten thin film. Such a method might be promising if the temperature distribution in the thin film could be precisely controlled spatially with time, since formation and growth of the crystal grain during and after the melting depend greatly on the temperature of the thin film. However, the conduction of heat in the thin film is considerably or significantly rapid before and after the melting, so that a steep temperature gradient cannot readily be localized within desired limited regions even during a short period of melting-resolidification, as suggested by simulation of two-dimensional thermal analysis [Gupta, Song, and Im, Mat. Res. Soc. Symp. Proc. 397, 465 (1996)]. Further, in short-time annealing by a short-wavelength light source like an excimer laser, the formation of a prescribed temperature distribution throughout the process of crystal grain formation is inherently impossible, since the melting and resolidification varies also in the film thickness direction as is evident from the aforementioned simulation of thermal analysis and the result of the in-situ observation [Hatano, Moon, Lee, and Grigoropoulos, J. Appl. Phys., 87, 36 (2000)]. The inventors of the present invention have noticed that the above facts cause difficulty in controlling the location of one-crystal grain formation or the control of the number density of formed crystal grains. The inventors of the present invention, after comprehensive investigation, have found a novel method that is completely different from conventional methods based on thermal distribution.

The present invention is characterized in that the starting thin film to be treated for melting and resolidification has regions different in state. The present invention is characterized also in that the starting thin film to be treated for melting and resolidification has a small region which is different in a state from a surrounding region, and a prescribed number of crystal grains or crystalline clusters are preferentially grown in the small regions.

The presence of regions different in state in the present invention affects the melting-resolidification. For explaining the effects, firstly a dynamic aspect of the melting-resolidification process is described, which is being elucidated in recent years.

The formation of the crystalline thin film by melting and resolidification is initiated with the melting by heating of the starting thin film. In the case where the thin film immediately before the melting has an inhomogeneous structure constituted of, for example, a polycrystalline matter and an amorphous matter containing crystalline clusters, the melting point is nonuniform in the thin film depending on the components of the thin film. Generally, the melting point of the bulk region in the crystal grain or the crystalline cluster ($T_C$), the melting point of their surface ($T_S$), the melting point of the grain boundary between the adjacent grains ($T_B$), and the melting point of the amorphous region ($T_A$) are known to be in the following relation: $T_C > T_S$ to $T_B > T_A$. In the case where the thin film immediately before the melting is constituted of such components, the variations of the melting process are classified and summarized as shown in Tables 1 to 4 in relation to the maximum temperature ($T_M$) for the melting, the heating rate (dT/dt), the duration of time of the maximum temperature, and the constitution of the starting thin film.

TABLE 1

| Maximum Temperature $T_M$ | Heating rate dT/dt | Duration of maximum temperature | Constitution of starting thin film | | |
|---|---|---|---|---|---|
| | | | Polycrystal composed of crystal grains or crystalline clusters | Amorphous matter containing crystal grains or crystalline clusters | Amorphous matter containing neither crystal grain nor crystalline cluster |
| $T_M > T_C$ | ∞ | >0 | Entire film melts instantaneously. | | |
| | <∞ Rapid | | At temperature exceeding $T_B$, melting begins at grain boundary, and the melting spreads from surface of crystal grain or crystalline cluster. Finally entire thin film melts. | At temperature exceeding $T_A$, melting begins at amorphous region. At temperature exceeding $T_S$, crystal grain or crystalline cluster begins to melt at the surface. Finally entire thin film melts. | At temperature exceeding $T_A$ melting begins locally. Finally entire thin film melts. |

TABLE 1-continued

| | | | Constitution of starting thin film | | |
|---|---|---|---|---|---|
| Maximum Temperature $T_M$ | Heating rate dT/dt | Duration of maximum temperature | Polycrystal composed of crystal grains or crystalline clusters | Amorphous matter containing crystal grains or crystalline clusters | Amorphous matter containing neither crystal grain nor crystalline cluster |
| | <∞ Slow | | | At temperature below $T_A$, crystal grain or crystalline cluster grows in solid phase and in amorphous region, spontaneous nucleation occurs at high rate and high density. At temperature exceeding $T_B$ melting begins at grain boundary, and melting spread from surface of crystal grain. Finally entire thin film melts. | At temperature below $T_A$, spontaneous nucleation occurs locally at high rate and high density. At temperature exceeding $T_B$ melting begins at grain boundary, and melting spread from surface of crystal grain. Finally entire thin film melt. |

TABLE 2

| | | | Constitution of starting thin film | | |
|---|---|---|---|---|---|
| Maximum Temperature $T_M$ | Heating rate dT/dt | Duration of maximum temperature | Polycrystal composed of crystal grains or crystalline clusters | Amorphous matter containing crystal grains or crystalline clusters | Amorphous matter containing neither crystal grain nor crystalline cluster |
| $T_C > T_M > T_B$ | ∞ | Long | Grain boundary melts instantaneously. Crystal grain or crystalline cluster becomes smaller in size by surface melting. | Amorphous region melts instantaneously. Crystal grain or crystalline cluster becomes smaller in size by surface melting. | Entire thin film melts instantaneously. |
| | | Short | Grain boundary melts instantaneously. Surface of crystal grain or of crystalline cluster melts, but hardly becomes smaller in size. | Amorphous region melts instantaneously. Surface of crystal grain or of crystalline cluster melts, but hardly becomes smaller in size. | |
| $T_C > T_M > T_B$ | <∞ Rapid | Long | At temperature exceeding $T_B$, melting begins at grain boundary. Crystal grain or crystalline cluster becomes smaller in size by surface melting. | At temperature exceeding $T_A$, melting begins at amorphous region. At temperature exceeding $T_S$, crystal grain or crystalline cluster becomes smaller in size owing to melting of surface. | At temperature exceeding $T_A$, melting begins locally. Finally entire thin film melts. |
| | | Short | At temperature exceeding $T_B$, melting begins at grain boundary. Crystal grain or crystalline cluster melts at the surface, but hardly becomes smaller in size. | At temperature exceeding $T_A$, melting begins at amorphous region. At temperature exceeding $T_S$, crystal grain or crystalline cluster melts at the surface, but hardly becomes smaller in size. | |

TABLE 3

| Maximum Temperature $T_M$ | Heating rate dT/dt | Duration of maximum temperature | Constitution of starting thin film | | |
|---|---|---|---|---|---|
| | | | Polycrystal composed of crystal grains or crystalline clusters | Amorphous matter containing crystal grains or crystalline clusters | Amorphous matter containing neither crystal grain nor crystalline cluster |
| $T_C > T_M > T_B$ | $0 < \infty$ Slow | Long | At temperature exceeding $T_B$, melting begins at grain boundary. Crystal grain or crystalline cluster becomes smaller in size by surface melting. | At temperature below $T_A$, crystal grain or crystalline cluster grows in solid phase and in amorphous region, spontaneous nucleation occurs at high rate and high density. At temperature exceeding $T_B$ melting begins at grain boundary, and crystal grain becomes smaller in size remarkably. | At temperature below $T_A$, spontaneous nucleation occurs locally at high rate and high density. At temperature exceeding $T_B$ melting begins at boundary, and crystal grain or crystalline cluster becomes smaller in size remarkably. |
| $T_C > T_M > T_B$ | $0 < \infty$ Slow | Short | At temperature exceeding $T_B$, melting begins at grain boundary. Crystal grain or crystalline cluster melts at surface, but hardly becomes smaller in size. | At temperature below $T_A$, crystal grain or crystalline cluster grows in solid phase and in amorphous region, spontaneous nucleation occurs at high rate and high density. At temperature exceeding $T_B$, melting begins at grain boundary, but crystal grain size hardly becomes smaller in size. | At temperature below $T_A$, spontaneous nucleation occurs locally at high rate and high density. At temperature exceeding $T_B$, melting begins at grain boundary, but crystal grain or crystalline cluster hardly becomes smaller in size. |

TABLE 4

| Maximum Temperature $T_M$ | Heating rate dT/dt | Duration of maximum temperature | Constitution of starting thin film | | |
|---|---|---|---|---|---|
| | | | Polycrystal composed of crystal grains or crystalline clusters | Amorphous matter containing crystal grains or crystalline clusters | Amorphous matter containing neither crystal grain nor crystalline cluster |
| $T_S > T_M > T_A$ | $\infty$ | $>0$ | No melting | Amorphous region only melts instantaneously. | Entire of thin film melts instantaneously. |
| | $<\infty$ Rapid | | | At temperature exceeding $T_A$, amorphous layer only melts. | At temperature exceeding $T_A$, entire thin film melts. |
| | $<\infty$ Midium | | | At temperature below $T_A$, crystal grain or crystalline cluster grows in solid phase and in amorphous region, spontaneous nucleation occurs at high rate and high density. At temperature exceeding $T_A$, remaining amorphous region only melts. | At temperature below $T_A$, spontaneous nucleation occurs at high rate and high density. At temperature exceeding $T_A$, remaining amorphous region only melts. |

TABLE 4-continued

| | | | Constitution of starting thin film | | |
|---|---|---|---|---|---|
| Maximum Temperature $T_M$ | Heating rate dT/dt | Duration of maximum temperature | Polycrystal composed of crystal grains or crystalline clusters | Amorphous matter containing crystal grains or crystalline clusters | Amorphous matter containing neither crystal grain nor crystalline cluster |
| $T_S > T_M > T_A$ | $<\infty$ Slow | >0 | No melting | At temperature below $T_A$, crystal grain or crystalline cluster grows in solid phase and in amorphous region, spontaneous nucleation occurs at high rate and high density to cause crystallization of entire thin film. Thereafter no melting occurs even at temperature exceeding $T_A$. | At temperature below $T_A$, spontaneous nucleation occurs at high rate and high density to cause crystallization of entire thin film. Thereafter no melting occurs even at temperature exceeding $T_A$. |

In annealing by a short-wavelength light source such as an excimer laser, the laser light penetrates to a small depth into the thin film to heat only the portion of the film near the surface, and the underlying portion of the film is heated by heat conduction from the surface portion. Therefore, the transition process in the film depth direction is included in the classification of the dynamic aspect of the melting process shown in Tables 1 to 4. That is, the melting begins near the surface and propagates toward the interface between the film and the underlying substrate. The state of the melting at the respective depth follows Tables 1 to 4.

Among the melting processes summarized in Tables 1 to 4, the systems in which none of the portion of the thin film is melted are excluded from consideration in the present invention since such systems are not the objects of the present invention. Therefore, the melting states are roughly classified into the states of (1) complete melting states in which the entire thin film is in a molten phase, and (2) incomplete melting states in which crystalline solid regions are dispersed in the molten phase, regardless of the variations of the maximum temperature, the heating rate, the maximum temperature duration time, and the constitution of the starting thin film. Next, the resolidification process will be discussed, where the thin film in either of the above two states of melting is cooled after completion of the heating.

For initiating the solidification of a thin film in a complete melting state, a crystalline nucleus should be spontaneously formed in the molten phase. According to a classical nucleation theory, the number of crystalline nuclei produced in a unit time in a unit volume in the molten phase, namely the nucleation rate (J) is a function of the free-energy barrier (W*) to the crystalline nucleus formation and the absolute temperature (T) of the system as $J \propto \exp(-W^*/kT)$. The free-energy barrier (W*) to the crystallite nucleation is a function of the melting point ($T_C$) of the crystal bulk and the supercooling ($\Delta T = T - T_C$) as $W^* - T_C/\Delta T$, whereby J increases multiple-exponentially with decrease of T. Therefore, the nucleation does not occur immediately after the temperature becomes lower than the melting point $T_C$, keeping the molten state. After a certain time when the temperature has become sufficiently lower, the nucleation occurs spontaneously and explosively to cause rapid solidification. The supercooling to cause observable spontaneous nucleation and the final crystal grain concentration depend on the cooling rate dT/dt and the free-energy barrier W* to the crystalline nucleus formation. The latter depends not only on the supercooling but also on the state of the starting material.

On the other hand, in a thin film in an incomplete melting state, the liquid-phase epitaxial growth begins simultaneously with the start of the cooling from seed crystallites that have been dispersed crystal grains or crystalline clusters remaining unmelted in the molten matrix. Therefore, the unmelted crystal grains or crystalline clusters remaining in the molten matrix grow precedently, and when the supercooling has become significant, the fine crystal grains are formed spontaneously and quickly only in the molten region. When the thin film is cooled gradually, or when the concentration of the crystal grains or crystalline clusters remaining in the molten matrix is sufficiently high, or the size thereof is sufficiently large, the entire thin film can be solidified only by the growth of the remaining crystal grains or crystalline clusters. On the other hand, when the thin film is cooled quickly, or when the concentration of the crystal grains or the crystalline clusters remaining in the molten matrix is significantly low, or the size thereof is significantly small, most of the regions in the thin film can be solidified with fine crystal grains by increasing the supercooling to cause spontaneous explosive nucleation before significant growth of the remaining crystal grains or crystalline clusters. Accordingly, the final number concentration of the crystal grains and the size distribution thereof depend on the cooling rate dT/dt and size distribution of the remaining crystal grains or the crystalline clusters remaining in the molten matrix. Further, the latter depends, as shown in Tables 1 to 4, on (1) the temperature conditions of the thin film such as the maximum temperature $T_M$, the heating rate dT/dt, and the maximum temperature duration; and (2) such a condition of the starting thin film as the following (2-1) and (2-2): (2-1) the structure associated with the crystallinity of the starting thin film which is described by the size distribution of number concentration of the crystal grains or the crystalline clusters, and (2-2) the thermodynamic properties such as the free-energy barrier to the crystallite nucleation in solid-phase crystallization before the melting of the starting thin film, the melting point $T_C$ of the bulk region in the crystal grains and crystalline clusters, the melting point $T_S$ of the surface thereof, the melting point $T_B$ of the grain boundary between the adjacent crystal grains, and the melting point $T_A$ of any amorphous region if it is present.

In the present invention, the wording "the size distribution of number concentration of crystal grains and crystalline clusters" means a physical quantity defined by a number of g-sized crystal grains or crystalline clusters in a unit volume, f(g), as a function of g.

Therefore, two "size distributions of number concentration of crystal grains and crystalline clusters" are equivalent to each other only when the f(g) values coincide for any g" in the entire size space region (g>0). Otherwise, they are different.

From the above consideration, it is generally concluded that the grain structure of the polycrystalline thin film derived by melting-resolidification depends on the heating temperature conditions for melting and cooling temperature conditions for resolidification, and the states of the starting thin film including the structure and thermodynamic properties, regardless of the state of complete melting or incomplete melting. From the standpoint of control of the spatial location of crystal grain formation, the above temperature condition control has been attempted so far, but this control is not easy as mentioned above. After comprehensive consideration, the inventors of the present invention have reasonably foreseen the possibility of control of the location of crystal grain formation by controlling the spatial state of the starting thin film. That is, the means for solving the problem in the present invention is to control the state of the starting thin film spatially. The effects thereof are described by reference to embodiments FIGS. 1A to 1H and 2A to 2H illustrate basic embodiments of the crystalline thin film and the process for production thereof of the present invention. FIGS. 3A to 3H through 9A to 9H illustrate developed embodiments. The drawings are schematic sectional views of a fraction of the thin film cut in a direction perpendicular to the surface or the interface. The thin film may be in contact with another layer or layers on its upper face or lower face in the present invention. In FIGS. 1A to 1H through 9A to 9H, only the thin film is illustrated without showing the additional layer. In FIGS. 1A to 1H through 9A to 9H, the numerals indicate the parts as follows: 1, a small region; 2, a surrounding region; 3, a starting thin film; 4, application of energy for melting-resolidification; 5, a crystal grain or a crystalline cluster; 6, a crystal grain; 7, a molten region; 8, a random crystalline cluster; and 9, a grain boundary.

Figure 1B:
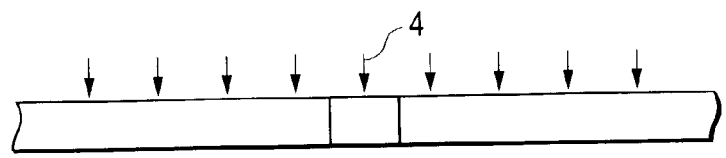
Figure 1C:
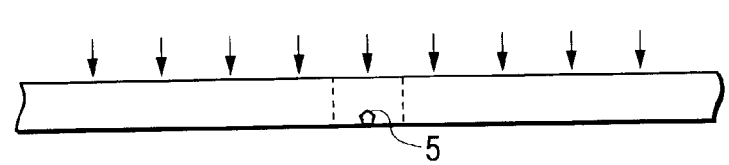
Figure 1D:
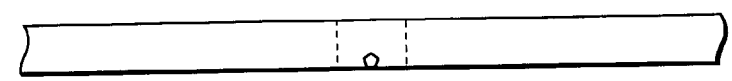
Figure 2A:
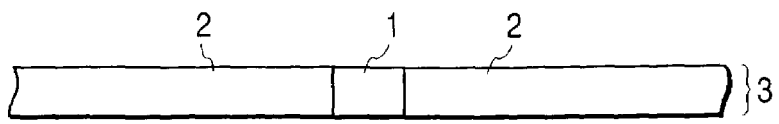
FIGS. 2A, 2B, 2C, 2D, 2E, 2F, 2G and 2H show a second basic embodiment of a crystalline thin film and a production process of the present invention.
Figure 2B:
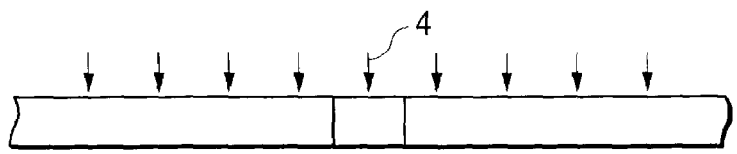
Figure 2C:
Figure 2D:
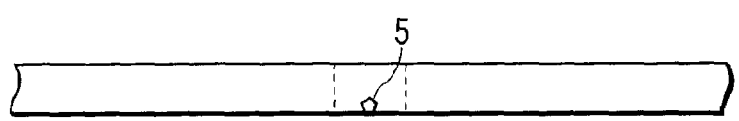

In order to control the state of the starting thin film spatially, in the starting thin film, small regions are formed which are in a state different from the surrounding regions, and in the small regions, a prescribed number of crystal grains or crystalline clusters are allowed to remain unmelted at the maximal melting, or crystallite nucleation is characterized preferentially therein. As shown in FIG. 1A or FIG. 2A, small regions 1 are formed in starting thin film 3 to coexist with surrounding regions 2 in contact with each other, and energy 4 is applied thereto to heat and melt the starting thin film 3 as shown in FIG. 1B or FIG. 2B. Small regions 1 and surrounding regions 2 are different in the state of the thin film 3 as shown below.

Small regions 1 and surrounding regions 2 are made different such that, between the final stage of the melting (FIG. 1C) and the stage after the end of energy application (FIG. 1D), one or more of a prescribed number of crystal grains or crystalline clusters remain unmelted in the small regions 1, and the crystal grains or the crystalline clusters in the surrounding regions 2 remain in a concentration much lower than that in the small regions 1; or the surrounding regions 2 are completely melted without the crystal grains or the crystalline clusters remaining unmelted. Otherwise, the small regions 1 and surrounding regions 2 are made different such that both of the small region 1 and surrounding region 2 are completely melted in the final stage of the melting (FIG. 2C), but nucleation occurs preferentially in the small regions 1 for formation of a crystal grain or a crystalline cluster 5 in the cooling-solidification process (FIG. 2D) because the free-energy barrier to crystallite nucleation in the small region 1 is lower than that in the surrounding region 2.

Figure 1E:
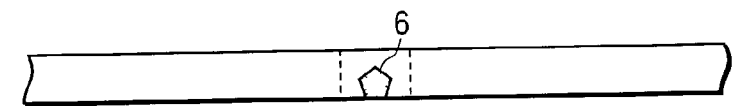
Figure 2E:
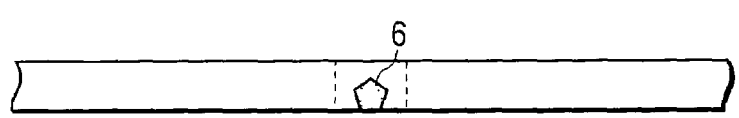

After the heating-melting of the starting thin film having the small region 1 and surrounding region 2 different in the state, during the resolidification, the crystal growth proceeds from the crystal grain or the crystalline cluster 5 which works as the seed crystal to solidify the adjacent molten-state thin film, and to form the crystal grain 6 (FIGS. 1E and 2E).

Figure 1F:
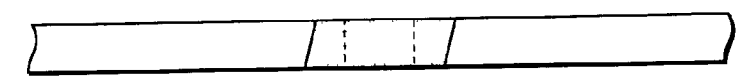
Figure 1G:
Figure 1H:
Figure 2F:
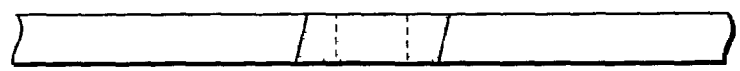
Figure 2G:
Figure 2H:
Figure 3A:
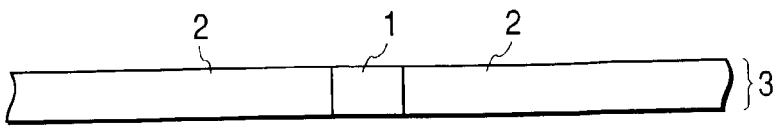
FIGS. 3A, 3B, 3C, 3D, 3E, 3F, 3G and 3H show another embodiment of a crystalline thin film and a production process of the present invention.
Figure 3B:
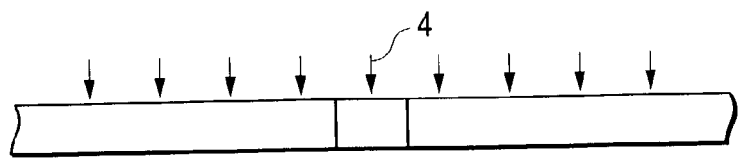
Figure 3C:
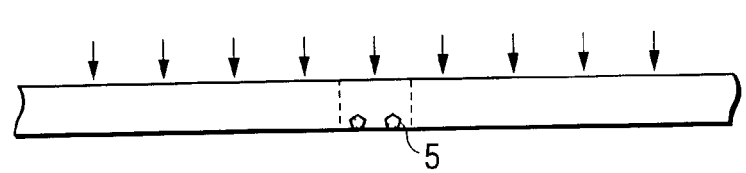
Figure 3D:
Figure 3E:
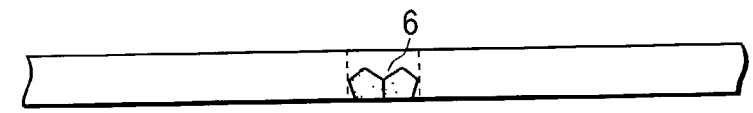
Figure 3F:
Figure 3G:
Figure 3H:
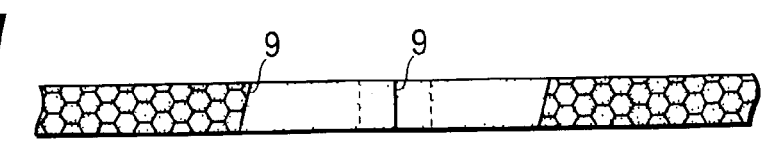

Thereafter, crystal grain 6 grows beyond small region 1 by solidifying the successively adjacent surrounding region 2 (FIGS. 1F and 2F). However, the growth of the crystal grain 6 is not endless. In the molten region 7 where the solidification is not characterized by crystal grain 6, at a certain supercooling, crystal grains or crystalline clusters 8 are formed spontaneously and explosively at random (FIGS. 1G and 2G). The crystal grain 6, having grown into the surrounding region 2, impinges upon the crystal grains or crystalline clusters which are not location-controlled, and grain boundaries 9 are formed between them (FIGS. 1H and 2H). Consequently, a crystalline thin film is formed by melting-resolidification with the crystal grain 6 at the controlled location in the small region 1.

In the case where the small region 1 is incompletely melted as shown in FIGS. 1A to 1H, the number of crystal grains or crystalline clusters 5 to remain in the small region 1 in the incomplete melting can be controlled precisely by the size distribution of number concentration of crystal grains or crystalline clusters contained before the melting, the volume of the small region 1, or the conditions of application of energy 4 for the heating-melting.

In the case where the small region 1 and surrounding region 2 are both completely melted, the number of crystal grains or crystalline clusters 5 formed preferentially in the small region 1 depends only on the free-energy barrier to nucleation of crystallite W*, which can be controlled precisely by the state of the small region 1 and the temperature at solidification.

In both cases, i.e., incomplete melting of the small region 1 and complete melting of the small region 1, the number of crystal grains 6 in the small region 1 is not limited to one, but two or more may be grown as shown in FIGS. 3A to 3H for the incomplete melting of the small region 1.

In FIGS. 1A to 1H, FIGS. 2A to 2H, and FIGS. 3A to 3H, the small region 1 for defining the location of formation of crystal grain 6 is provided as a single domain surrounded by the surrounding region 2. However, the embodiment is not limited thereto, and plural small regions 1 may be provided, discontinuously or scatteredly in the present invention.

Figure 4A:
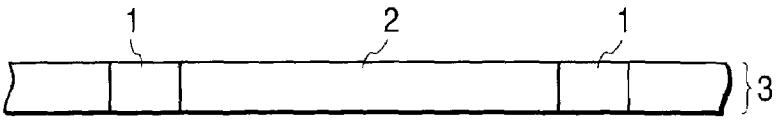
FIGS. 4A, 4B, 4C, 4D, 4E, 4F, 4G and 4H show another embodiment of a crystalline thin film and a production process of the present invention.
Figure 4B:
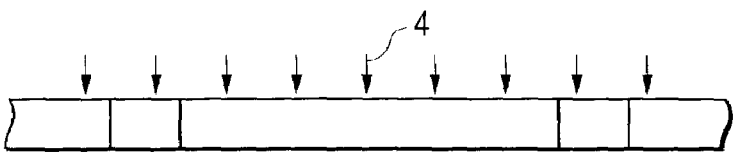
Figure 4C:
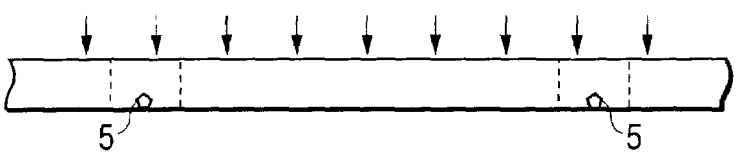
Figure 4D:
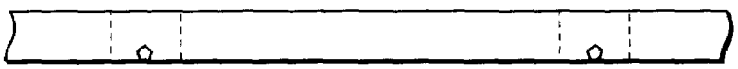
Figure 4E:
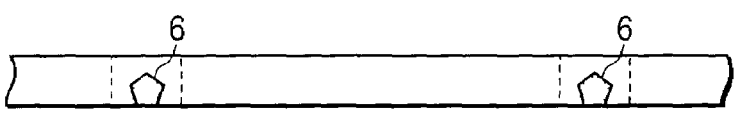
Figure 4F:
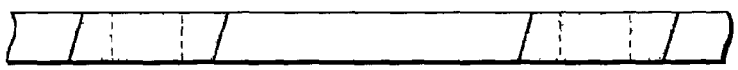
Figure 4G:
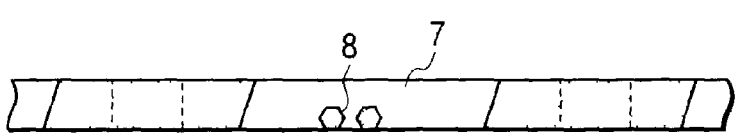
Figure 4H:
Figure 5A:
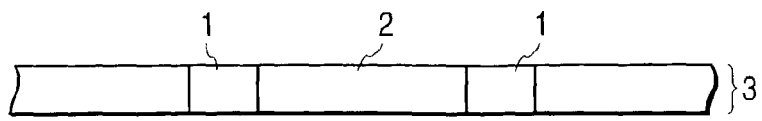
FIGS. 5A, 5B, 5C, 5D, 5E, 5F, 5G and 5H show another embodiment of a crystalline thin film and a production process of the present invention.
Figure 5B:
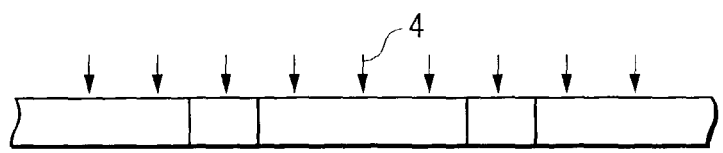
Figure 5C:
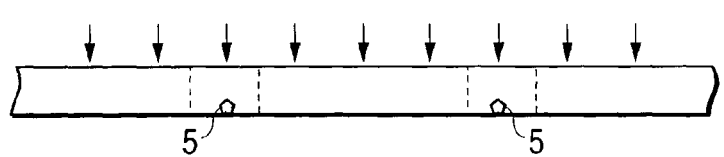
Figure 5D:
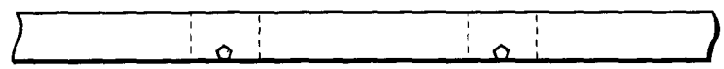
Figure 5E:
Figure 5F:
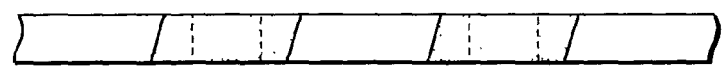
Figure 5G:
Figure 5H:
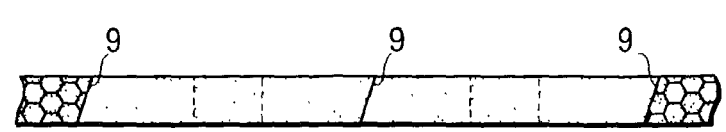

FIGS. 4A to 4H, FIGS. 5A to 5H, and FIGS. 6A to 6H show other embodiments in which the small region 1 is incompletely melted, corresponding to embodiment of FIGS. 1A to 1H. In the case where adjacent small regions 1 are far apart from each other (FIG. 4A), fine crystal grains or crystalline clusters 8 are formed spontaneously and explosively at random between crystal grains formed at the positions of the respective small regions 1 (FIG. 4H). However, in the case where the distance between adjacent small regions 1 is short enough (FIG. 5A), crystal grains having grown therefrom collide together at around the midpoint between them to form the grain boundary 9 before the spontaneous explosive formation of crystal grains or crystalline clusters 8 (FIG. 5H).

Figure 6A:
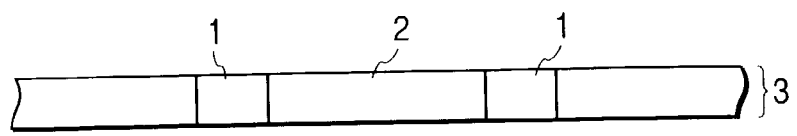
FIGS. 6A, 6B, 6C, 6D, 6E, 6F, 6G and 6H show another embodiment of a crystalline thin film and a production process of the present invention.
Figure 6B:
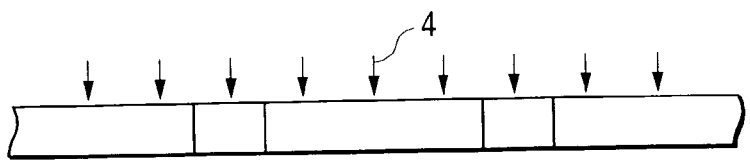
Figure 6C:
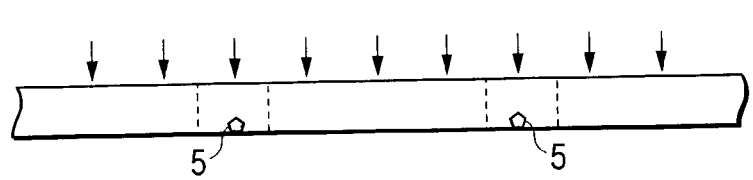
Figure 6D:
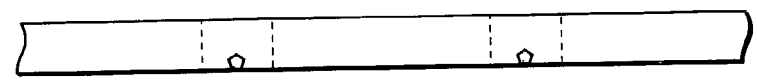
Figure 6E:
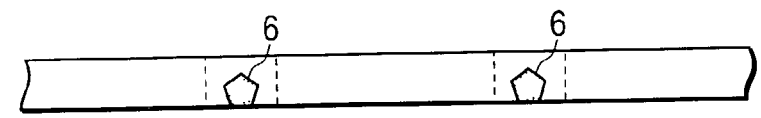
Figure 6F:
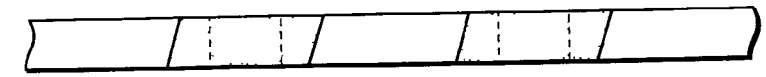
Figure 6G:
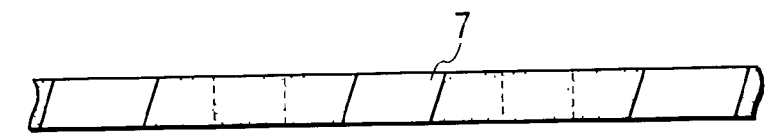
Figure 6H:
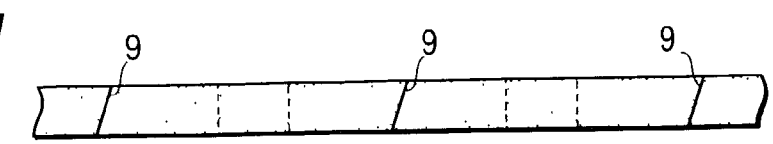
Figure 7A:
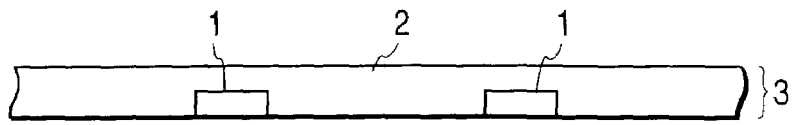
FIGS. 7A, 7B, 7C, 7D, 7E, 7F, 7G and 7H show another embodiment of a crystalline thin film and a production process of the present invention.
Figure 7B:
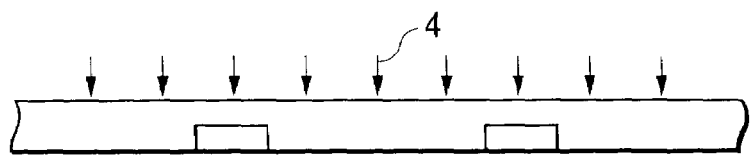
Figure 7C:
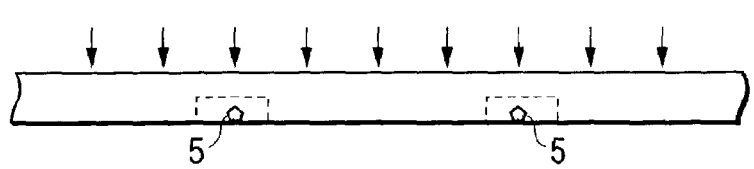
Figure 7D:
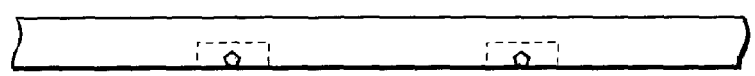
Figure 7E:
Figure 7F:
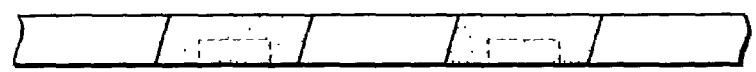
Figure 7G:
Figure 7H:

With the small regions 1 arranged throughout the thin film with the maximum distance less than the aforementioned distance (FIG. 6A), the entire thin film can be constituted of locationally controlled crystal grains 6 (FIG. 6H). With the small regions 1 arranged at regular intervals, the thin film can be formed with locationally controlled crystal grains 6 in nearly the same sizes.

In examples shown in FIGS. 4A to 4H, FIGS. 5A to 5H, and FIGS. 6A to 6H, the small regions 1 are incompletely melted. However, a similar process can be employed in the cases where the small regions 1 are completely melted as shown in FIGS. 2A to 2H.

In the embodiments shown in FIGS. 1A to 1H through FIGS. 6A to 6H, the small regions 1 and surrounding regions 2 are arranged two-dimensionally in the plane direction of the starting thin film 3. In the present invention, a three-dimensional configuration may be employed in which the regions are arranged also in the thickness direction of the starting thin film 3. For example, as shown in FIGS. 7A to 7H, the small regions 1 are formed in the half thickness portion of the thin film, and are surrounded from the upper side and peripheral side by the surrounding regions 2, whereby similar melting-resolidification can be conducted. In FIGS. 7A to 7H, the small regions 1 arranged at short intervals as in FIGS. 6A to 6H are melted incompletely. Three-dimensional arrangements of the small regions 1 are also possible in the constitutions as shown in FIGS. 1A to 1H through FIGS. 5A to 5H, or in the cases where the small regions 1 are completely melted. Furthermore, the three dimensional configuration of the small regions 1 is not limited to those shown in FIGS. 7A to 7H but includes various variations.

Figure 8A:
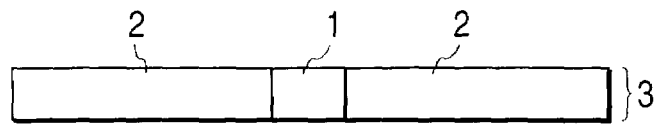
FIGS. 8A, 8B, 8C, 8D, 8E, 8F, 8G and 8H show another embodiment of a crystalline thin film and a production process of the present invention.
Figure 8B:
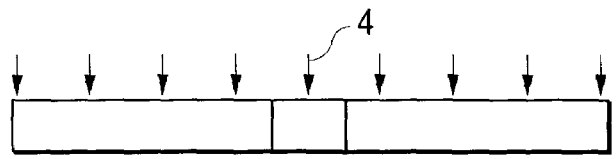
Figure 8C:
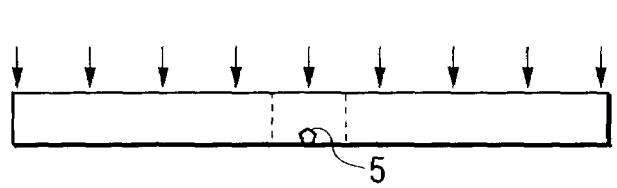
Figure 8D:
Figure 8E:
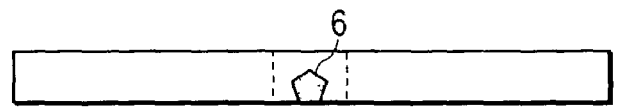
Figure 8F:
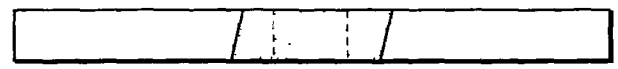
Figure 8G:
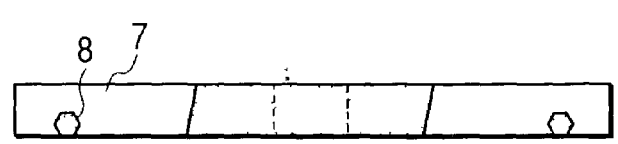
Figure 8H:
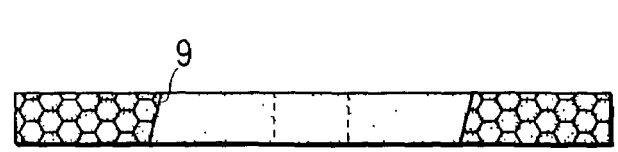
Figure 9A:
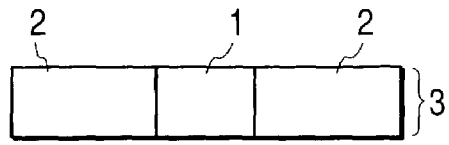
FIGS. 9A, 9B, 9C, 9D, 9E, 9F, 9G and 9H show another embodiment of a crystalline thin film and a production process of the present invention.
Figure 9B:
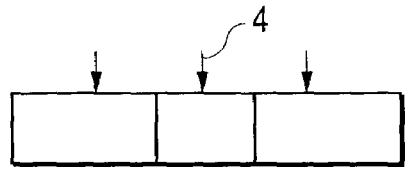
Figure 9C:
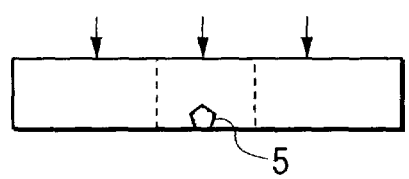
Figure 9D:
Figure 9E:
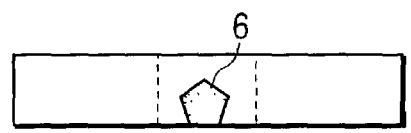
Figure 9F:
Figure 9G:
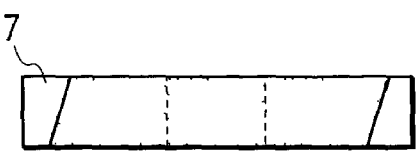
Figure 9H:

In the embodiments shown in FIGS. 1A to 1H through FIGS. 7A to 7H, the spreading area of the starting thin film 3 in the plane direction is far greater than the size of the small regions 1 or crystal grains 6, or than the intervals between the small regions 1. However, the area and the size of the intervals may be made comparable in size. For example, in FIGS. 8A to 8H, with the starting thin film 3 in a size shown in the drawing, when the small region 1 is formed to be surrounded by the surrounding regions 2 (FIG. 8A) and melting-resolidification is conducted to cause incomplete melting of the small region 1, the resulting resolidified thin film has crystal grain 6 surrounded by crystal grains or crystalline clusters 8 formed by spontaneous random nucleation not controlled locationally (FIG. 8H). In FIGS. 9A to 9H, with the starting thin film 3 smaller in size in the plane direction (FIG. 9A), crystal grain 6 grows throughout the entirety of the starting thin film 3, before explosive occurrence of spontaneous nucleation of crystal grains or crystalline clusters 8 without location control, to form a resolidified thin film constituted only of crystal grain 6 (FIG. 9H). The melting-resolidification shown in FIGS. 8A to 8H and FIGS. 9A to 9H can also be conducted in the case where the small region 1 melts completely as shown in FIGS. 2A to 2H, in the case where plural crystal grains 6 grow in the small region 1 as shown in FIGS. 3A to 3H, in the case where the starting thin film 3 contains plural small regions 1 as shown in FIGS. 4A to 4H through FIGS. 6A to 6H, or in the case where the small regions 1 are arranged three-dimensionally as shown in FIGS. 7A to 7H. The starting thin films 3 shown in FIGS. 8A to 8H and FIGS. 9A to 9H may be provided in plurality scattered on a substrate not shown in the drawings.

In the embodiments shown in FIGS. 1A to 1H through FIGS. 9A to 9H, the starting thin film 3 has two kinds of regions different in the state, namely the small region 1 and surrounding region 2, but three or more kinds of regions different in the state may be provided. For example, the small regions 1 as shown in FIGS. 1A to 1H in which respectively single crystal grain 6 is preferentially formed, and another kind of small regions 1 as shown in FIGS. 3A to 3H in which plural crystal grains 6 are formed may coexist on one starting thin film 3. Otherwise, plural small regions 1 having different structures two-dimensionally or three-dimensionally may coexist on a starting thin film 3.

A basic embodiment for forming small regions 1 and surrounding regions 2 in coexistence in the starting thin film 3 in the melting-resolidification process is explained below.

In the case where the small region 1 is incompletely melted, the small region 1 and surrounding region 2 are made different from each other such that, in the final stage of melting of the thin film 3, one or a certain number of crystal grains or crystalline clusters 5 remain unmelted in the small region 1, whereas, in the surrounding region 2, crystal grains or crystalline clusters 5 remain unmelted at a concentration much lower than that in the small region 1 or do not remain to result in complete melting. As described before, the size distribution of number concentration of unmelted crystal grains or crystalline clusters depends on the structure relating to the crystallinity of the starting thin film defined by the size distribution of number concentration of the unmelted crystal grains or crystalline clusters contained in the starting film and on thermodynamic properties such as the free-energy barrier to nucleation of crystallite, the melting point of the bulk region in the crystal grain or crystalline cluster, the melting point of the surface thereof, the melting point of grain boundary between the adjacent crystal grains, and the melting point of the amorphous region when the starting thin film contains an amorphous region. Therefore, for the present purpose, any of the above factors is made different between the small region 1 and surrounding region 2.

Unmelted crystal grains or crystalline clusters can be allowed to remain, for example, when the size distribution of number concentration of crystal grains or crystalline clusters shifts to a larger size range than that of the surrounding region 2 (grains or clusters with larger size are larger in number), or has a larger concentration (number of grains or clusters is larger), and the starting thin film is melted without undergoing solid-phase crystallization. Even when the starting thin film is melted undergoing solid-phase crystallization, the difference in the initial size distribution of number concentration of crystal grains or crystalline clusters is reflected directly to the size distribution after the solid-phase crystallization, whereby unmelted crystal grains or crystalline clusters can be made to remain in the melt selectively in the small region 1. In the case where the solid-phase crystallization before melting of the starting thin film is not characterized by the growth of the grains larger than the critical size for crystallite nucleation, but is governed mainly by the crystallite nucleation process, the height of the free-energy barrier to nucleation of crystallite in the small region 1 is made different from that in the surrounding region 2. The height of the free-energy barrier to crystallite nucleation in the solid-phase crystallization depends on the elemental composition ratio of the thin film, the concentration of the impurity contained, the adsorbate on the surface, and the state of the interface between the thin film and the substrate. Therefore, by designing any of the above factors to be different between the regions, the small region 1 and surrounding region 2 can be provided in one and the same thin film. Thereby, immediately before the melting, the size distribution of number concentration of crystal grains or crystalline clusters in the small region 1 belongs to a larger size range than that in the surrounding region 2, whereby the unmelted crystal grain or crystal cluster is allowed to remain selectively in the small region 1. Otherwise, by designing the melting point of any of the bulk region in the crystal grain or crystalline clusters, the surface thereof, and grain boundary between adjacent crystal grains in the small region 1 to be higher than that of the surrounding region 2, an unmelted crystal grain or crystalline cluster can be allowed to remain selectively in the small region 1 in the final stage of the melting process.

In the other case where the small region 1 is completely melted, the state of the starting thin film is made different between the small region 1 and surrounding region 2 by designing the free-energy barrier to nucleation of crystallite from molten phase W* to be lower in the small region 1 than in the surrounding region 2. Thereby, in the cooling-solidification process after complete melting of the small region 1 and surrounding region 2, nuclei of the crystal grains or crystalline clusters are preferentially formed in the small region 1 while the supercooling is not significant. As described before, the concentration of the crystal grains or crystalline clusters formed by spontaneous nucleation depends only on the free-energy barrier W* to nucleation of crystallite, and the value of W* depends on the state of the small region 1 such as the elemental composition ratio of the starting thin film, the concentration of the impurity contained, the adsorbate on the surface, and the state of the interface between the thin film and the substrate. Therefore, the small region 1 and the surrounding region 2 are made different in any of the above factors.

FIGS. 10 to 13 show embodiments of the element of the present invention which employ the crystalline thin film formed by the above described melting-resolidification process. FIGS. 10 to 13 show partial cross sections of the thin film cut in a direction perpendicular to the surface or the interface thereof similarly as FIGS. 1A to 1H through FIGS. 9A to 9H. In FIGS. 10 to 13, a crystal grain or crystalline cluster 8 formed by random spontaneous nucleation as shown in FIGS. 1A to 1H through FIGS. 5A to 5H or FIGS. 8A to 8H is omitted and only the locationally controlled crystal grain 6 and substrate 100 for supporting the thin film are shown.

Figure 10:
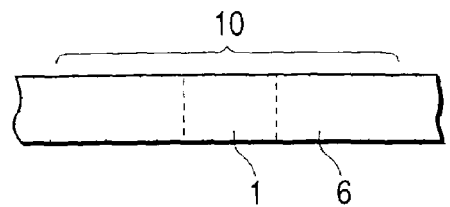
FIG. 10 shows a first basic embodiment of the element of the present invention.

In the crystalline thin film of the present invention, the position of the crystal grain 6 is determined by the position of the small region 1, and the size thereof is predetermined. Therefore, in forming the element employing crystal grain as the active region, the active region employing crystal grain 6 is readily related to the position of the crystal grain 6. For example as shown in FIG. 10, an active small region 10 of the element can be confined to the inside of the crystal grain 6. Thereby, the performance of the element is improved and variation thereof among the elements is decreased since no grain boundary is included in the active small region 10 of the element.

Figure 11:
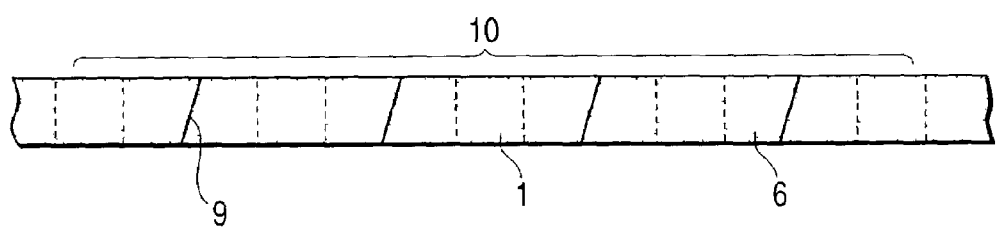
FIG. 11 shows a second basic embodiment of the element of the present invention.

In the crystalline thin film prepared by the process for providing plural small regions 1 as shown in FIGS. 5A to 5H through 7A to 7H, the active small region 10 can be provided in the region containing a desired number of crystal grains 6 as shown in FIG. 11. In this case also, the number of crystal grains 6 or the density of the grain boundary included in the active small region 10 of the element can be controlled, since the positions of the small regions 1 are predetermined. Thereby, the variation between the elements can be reduced.

The active small region 10 of the element shown in FIG. 10 or 11 is formed by providing suitable input-output terminals onto the crystal grain 6. According to the kind of the element, the input-output terminals are in any positions of the upper face, lower face, and peripheral face of the thin film comprising the crystal grain 6. The input-output terminal may be in contact with the crystal grain 6 or apart therefrom depending on the type of the signals input to or output from the active region of the element.

Figure 12:
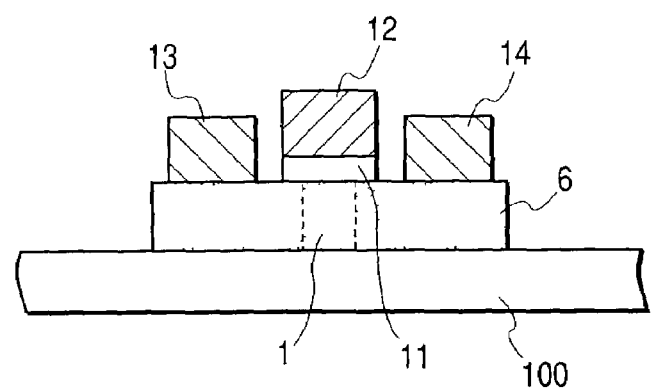
FIG. 12 shows another embodiment of the element of the present invention.
Figure 13:
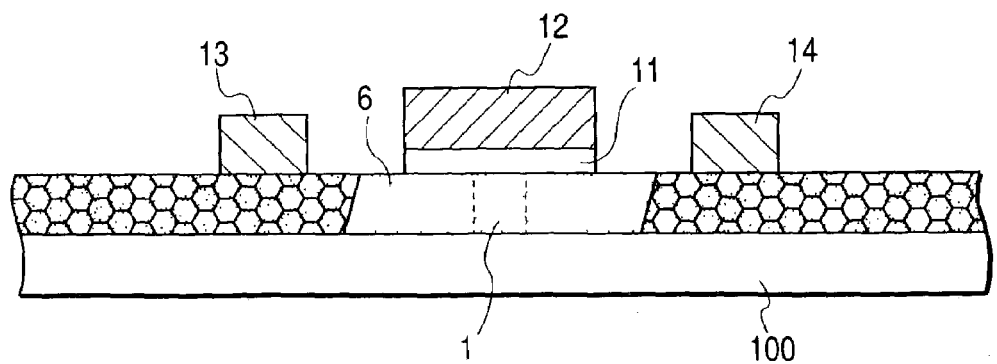
FIG. 13 shows another embodiment of the element of the present invention.

FIGS. 12 and 13 show examples of MOS type thin transistors (TFT) provided on a crystalline thin film constituted of a semiconductor material. In the drawings, the numerals indicate the parts as follows: 11, a gate insulation film; 12, a gate electrode; 13, a source electrode; 14, a drain electrode; and 100, a substrate.

The element shown in FIG. 12 is a MOS type TFT employing single crystal grain 6 formed isolatedly on the substrate 100 through the process shown in FIGS. 9A to 9H. On the surface of the crystal grain 6, there are provided a gate electrode 12 with interposition of a gate insulation film 11, a source electrode 13, and a drain electrode 14. In the regions of the crystal grain 6 under the electrodes, are formed respectively a channel region, a source region, and a drain region by controlling the conductivity type. This element can give high performance since the entire element is formed inside a single crystal grain 6 without a grain boundary. By forming plural elements on one and the same substrate 100 as shown in FIG. 12, the variation of the performances among the elements can be decreased. In the example shown in FIG. 13, a crystalline thin film is formed by a process shown in FIGS. 1A to 1H or FIGS. 2A to 2H, a gate region only is formed on the portion of the single crystal grain 6, and a source region and a drain region are formed on a portion of the thin film adjacent to the crystal grain 6 and containing crystal grains or crystalline clusters 8 not locationally controlled. In such a MOS type TFT, the element performance depends mainly on the electric charge transfer in the channel region as the active region. Therefore, the plural elements shown in FIG. 13 give high performance with less performance variation among the elements.

In the example shown in FIGS. 12 and 13, the active region of the element does not contain a grain boundary. However, the crystalline thin film having the grain boundary 9 controlled locationally, which is obtained by the process of any of FIGS. 3A to 3H and FIGS. 5A to 5H through FIGS. 7A to 7H, can contain the crystalline grain boundary 9 in the active region of the element. The element having the grain boundary 9 in the active region may be inferior in the absolute value of the performance, but the variation among the elements can be decreased by controlling the density of the grain boundaries.

Figure 14:
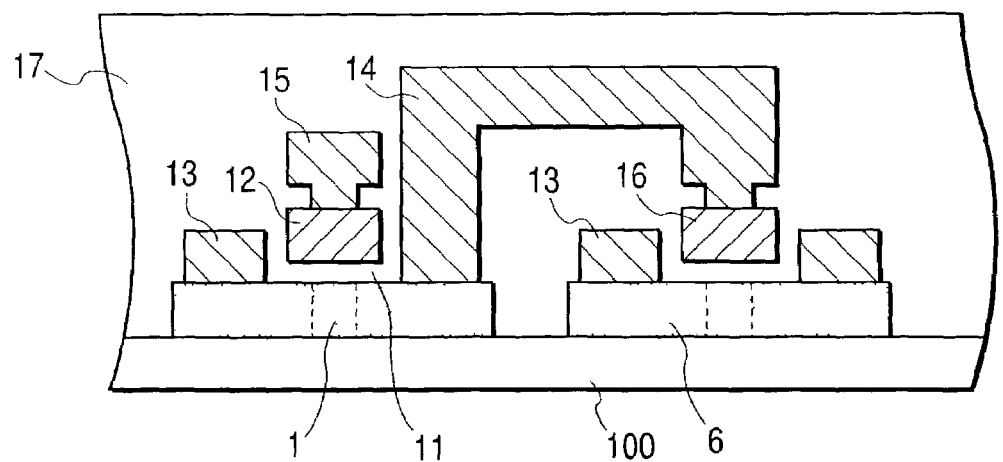
FIG. 14 shows an embodiment of the circuit of the present invention.

FIG. 14 shows an example of the circuit of the present invention using the elements of the present invention as shown above. In the drawing, the numerals indicate the parts as follows: 15, a gate wiring electrode of a first TFT; 16, a gate wiring electrode of a second TFT; and 17, an insulating layer. This circuit has, as a part, two MOS-type TFTs comprising respectively single crystal grains 6 grown from the small region 1 as the growth center as shown in FIG. 12 on a substrate 100. A drain electrode 14 of the first TFT controlled by a gate electrode 12 is wired to the gate wiring electrode 16 of the second TFT, and the electrodes and the wiring are insulated from each other by the insulating layer 17. Thus, the second TFT controlled by the gate wiring electrode 16 is controlled by the drain voltage of the first TFT. In such a circuit, the element performances of the first TFT and the second TFT should be controlled precisely. The circuit of this example not containing grain boundary in the active region will satisfy the above conditions.

Figure 15:
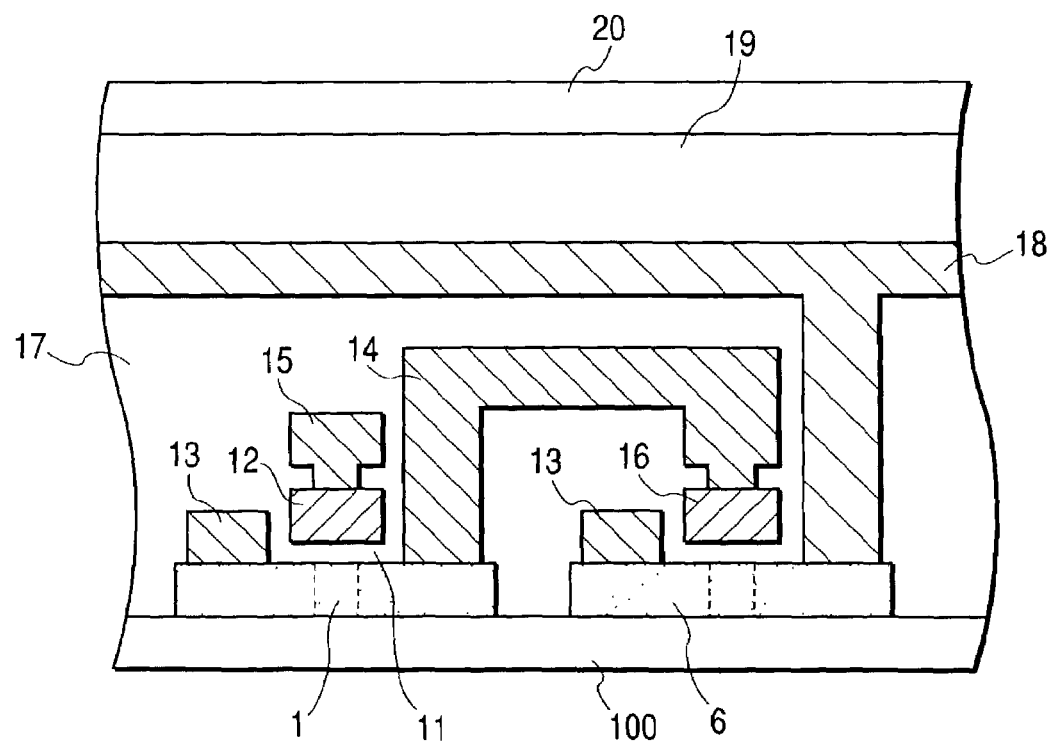
FIG. 15 shows an embodiment of the device of the present invention.

FIG. 15 shows an example of the image displaying device of the present invention, which comprises the circuit of the present invention. In the drawing, the numerals indicate the parts as follows: 18, an electrode; 19, a light-emitting layer or a light-transmission control layer; and 20, an upper electrode. This device comprises, as a part, two connected TFTs like those shown in FIG. 14. The drain electrode of the second TFT is connected to the electrode 18 at the upper position of the element. On the electrode 18, the light-emitting layer or light-transmission control layer 19 is provided, and further thereon, the upper electrode 20 is provided. The voltage applied to the light-emitting layer or light-transmission control layer 19 or the current introduced thereto by the electrode 18 and the upper electrode 20 depends on the drain voltage or current of the second TFT controlled by the first TFT drain voltage. The light emission intensity or light transmittance of the light-emitting layer or light transmission control layer 19 is controlled by the voltage applied thereto or electric current introduced thereto. The image displaying device of this embodiment employs the above element as a display unit for one pixel, and is constituted of such elements arranged in a grid pattern. For achieving uniform light intensity and time response, the variation of the performance between the pixels should be minimized. The above device employing the circuit comprising elements containing no grain boundary in the active region satisfies the above conditions.

EXAMPLE 1

A crystalline silicon thin film formed by the process shown in FIGS. 1A to 1H is described as Example 1 of the present invention.

An amorphous silicon thin film containing crystalline silicon clusters was formed in a thickness of 50 nm by vapor deposition on a substrate composed of silicon oxide and other components and having an amorphous surface. This amorphous silicon thin film containing crystalline silicon clusters was irradiated with an energy beam from the surface side excluding locally a small region of 1 µm diameter to partially amorphize the crystalline silicon clusters in the irradiated region of the thin film. The resulting film was employed as the starting thin film.

This starting thin film was irradiated with a KrF excimer laser beam at an energy density of about 200 mJ/cm² for 30 nsec for melting and resolidification to obtain a crystalline thin film.

The resulting crystalline thin film was examined regarding the crystal grain shape. It was found that single crystal grain had grown around the above small region of about 1 µm diameter as the center to a size of about 2 µm diameter. The surrounding portion was filled randomly with various sizes of fine crystal grains of an average diameter of about 50 nm.

In the starting thin film of this example, in the small region of about 1 µm diameter which was not irradiated with the energy beam, the average value of the size distribution of number concentration of crystalline clusters, and the concentration thereof were higher than in the other regions. This difference in the size distribution of number concentration of crystalline clusters caused the difference in state among the continuously placed regions to form "small region 1" of about 1 µm diameter as shown in FIGS. 1A to 1H. By in-situ observation of the melting-resolidification process of the energy beam-irradiated thin film and of a non-irradiated thin film under the aforementioned melting-resolidification conditions, the former was confirmed to be completely melted, whereas the latter was confirmed to be incompletely melted.

As described above, in this example, the starting thin film was an amorphous thin film containing crystalline clusters, and the size distribution of number concentration of crystalline clusters was different between the regions in the amorphous base material of the starting thin film. Thereby, in the melting-resolidification of the starting thin film, the size distribution of number concentration of the remaining unmelted crystalline clusters was different between the regions to form a crystalline thin film constituted of crystal grains controlled in spatial location.

EXAMPLE 2

Another crystalline silicon thin film that can be formed by the process shown in FIGS. 1A to 1H is described as Example 2 of the present invention.

An amorphous silicon thin film containing crystalline silicon clusters was formed in a thickness of 50 nm by vapor deposition on a substrate composed mainly of silicon oxide and having an amorphous surface in the same manner as in Example 1. This amorphous silicon thin film containing crystalline silicon clusters was irradiated with an energy beam from the surface side excluding locally the small region of 0.7 µm diameter to obtain the starting thin film. In this example, being different from Example 1, in the energy beam-irradiated region, the crystalline silicon clusters contained in the thin film were completely made amorphous.

This starting thin film is irradiated with a ArF excimer laser beam at an energy density of about 210 mJ/cm² for 30 nsec for melting and resolidification to obtain a crystalline thin film.

The resulting crystalline thin film was examined regarding the crystal grain shape. It was found that a single crystal grain had grown around the above small region of about 0.7 µm diameter as the center to a size of about 1.5 µm diameter. The surrounding portion was filled randomly with various sizes of fine crystal grains of an average diameter of about 40 nm.

In the starting thin film of this example, in the small region of about 0.7 µm diameter which was not irradiated with the energy beam, a crystalline cluster was present, but not present in the other portion. This difference in the size distribution of number concentration of crystalline clusters caused the difference in the state among the continuously placed regions to form "small region 1" of about 0.7 µm diameter as shown in FIGS. 1A to 1H. By in-situ observation of the melting-resolidification process of the energy beam-irradiated thin film made completely amorphous and of a non-irradiated thin film under the aforementioned melting-resolidification conditions, the energy beam-irradiated thin film was confirmed to have been melted completely, whereas the non-irradiated thin film was confirmed to have been melted incompletely, and the former was melted at a temperature lower than the latter.

As described above, in this example, the starting thin film was an amorphous thin film containing crystalline clusters, and the size distribution of number concentration of crystalline clusters was different between the regions in the amorphous base material of the starting thin film. Thereby, in the melting-resolidification of the starting thin film, the size distribution of number concentration of the remaining unmelted clusters was different between the regions to form a crystalline thin film constituted of crystal grains controlled in spatial location.

EXAMPLE 3

A third crystalline silicon thin film formed by the process shown in FIGS. 1A to 1H is described as Example 3 of the present invention.

A polycrystalline silicon thin film was formed in a thickness of 80 nm by vapor deposition on a substrate having an amorphous surface composed of an inorganic silicon compound as the starting thin film. The deposition of the starting film was conducted by a selective deposition means to obtain an average diameter of about 300 nm in a small region of about 2 μm square, and of about 100 nm in other regions in the thin film plane.

This starting thin film is irradiated with an XeCl excimer laser beam at an energy density of about 300 mJ/cm$^2$ for 40 nsec for melting and resolidification to obtain a crystalline thin film.

The resulting crystalline thin film was examined regarding the crystal grain shape. It was found that single crystal grain had grown around the above small region of about 2 μm square as the center to a grain size of about 3 μm diameter. The surrounding portion was filled randomly with various sizes of fine crystal grains of an average diameter of about 100 nm.

In the starting thin film of this example, in the small region of about 2 μm square, the average value of the size distribution of number concentration of crystal grains or crystalline clusters was higher than in the other regions. This difference in the size distribution of number concentration of crystal grains caused the difference in state among the continuously placed regions to form "small region 1" of about 2 μm square as shown in FIGS. 1A to 1H. By in-situ observation of the melting-resolidification process of the polycrystalline silicon thin films of an average diameter of about 100 nm and of an average diameter of about 300 nm under the aforementioned melting-resolidification conditions, the former was confirmed to have been completely melted, whereas the latter was confirmed to have been incompletely melted.

As described above, in this example, the starting thin film was a polycrystalline thin film containing crystal grains or crystalline clusters, and the size distribution of number concentration of crystalline clusters was different between the regions. Thereby, in the melting-resolidification of the starting thin film, the size distribution of number concentration of the remaining unmelted crystal grains or crystalline clusters was different between the regions to form a crystalline thin film constituted of crystal grains controlled in spatial location.

EXAMPLE 4

A fourth crystalline silicon thin film formed by the process shown in FIGS. 1A to 1H is described as Example 4 of the present invention.

A polycrystalline silicon thin film was formed in a thickness of 80 nm by vapor deposition on a substrate having an amorphous surface composed of an inorganic silicon compound. Then, this polycrystalline silicon thin film was irradiated with an energy beam from the surface side excluding locally a small region of about 0.7 μm diameter to make it amorphous in the same manner as in Example 2. This was employed as the starting thin film.

This starting thin film is irradiated with an XeCl excimer laser beam at an energy density of about 250 mJ/cm$^2$ for 40 nsec for melting and resolidification to obtain a crystalline thin film.

The resulting crystalline thin film was examined regarding the crystal grain shape. It was found that a single crystal grain had grown around the above small region of about 0.7 μm diameter as the center to a size of about 2 μm diameter. The surrounding portion was filled randomly with various sizes of fine crystal grains of an average diameter of about 60 nm.

In the starting thin film of this example, the small region of about 0.7 μm diameter was polycrystalline, and the other region was amorphous. This difference caused the difference in state among the continuously placed regions to form "small region 1" of about 0.7 μm diameter shown in FIGS. 1A to 1H. By in-situ observation of the melting-resolidification process of the amorphous silicon thin film and the polycrystalline silicon thin film, the former was confirmed to have been completely melted, whereas the latter was confirmed to have been incompletely melted. The former was melted at a temperature lower than the latter.

As described above, in this example, the crystalline thin film had an amorphous region and a polycrystalline region, and the crystallinity was different between the regions. Thereby, in the melting-resolidification of the starting thin film, the size distribution of number concentration of the remaining unmelted crystal grains or crystalline clusters was different between the regions to form a crystalline thin film constituted of crystal grains controlled in spatial location.

EXAMPLE 5

A fifth crystalline silicon thin film formed by the process shown in FIGS. 1A to 1H is described as Example 5 of the present invention.

A polycrystalline silicon thin film was formed in a thickness of 80 nm by vapor deposition on a substrate having an amorphous surface composed of a silicon oxide in the same manner as in Example 4. Then this thin film is doped with phosphorus excluding locally a small region of about 1.5 μm diameter and employed as the starting thin film.

This starting thin film is irradiated with an XeCl excimer laser beam at an energy density of about 350 mJ/cm$^2$ for 40 nsec for melting and resolidification to obtain a crystalline thin film.

The resulting crystalline thin film is examined regarding the crystal grain shape. It would be found that a single crystal grain had grown around the above small region of about 1.5 μm diameter as the center to a size of about 2.5 μm diameter and the surrounding portion filled randomly with various sizes of fine crystal grains of an average diameter of about 150 nm.

In the starting thin film of this example, the small region of about 0.1.5 μm diameter contains little phosphorus, whereas the other region contains phosphorus. This difference makes the difference in state among the continuously placed regions to form "small region 1" of about 1.5 μm diameter shown in FIGS. 1A to 1H. By in-situ observation of the melting-resolidification process of the polycrystalline silicon thin film containing phosphorus and the polycrystalline silicon thin film not containing phosphorus, the former is confirmed to have been completely melted, whereas the latter is confirmed to have been incompletely melted. The former is melted at a temperature lower than the latter. Further, in the phosphorus-containing polycrystalline thin film, the impurity phosphorus is confirmed to segregate at the grain boundary.

As described above, in this example, the starting thin film is a polycrystalline silicon thin film containing an impurity, having regions of different melting points depending on the impurity concentration. Thereby, in the melting-resolidification of the starting thin film, the size distribution of number concentration of the remaining unmelted crystal grains or crystalline clusters is different between the regions to form a crystalline thin film constituted of crystal grains controlled in spatial location.

EXAMPLE 6

A sixth crystalline silicon thin film formed by the process shown in FIGS. 1A to 1H is described as Example 6 of the present invention.

An amorphous thin film containing neither a crystal grain nor a crystalline cluster was formed in a thickness of 100 nm by vapor deposition on a substrate having an amorphous surface composed of silicon oxide. Then, this amorphous silicon thin film was irradiated with an energy beam from the surface side excluding locally a small region of about 0.6 μm diameter to change the state of the interface between the amorphous silicon thin film and the underlying substrate in the irradiated region. This was employed as the starting thin film.

This starting thin film was irradiated with a KrF excimer laser beam at an energy density of about 310 mJ/cm$^2$ for 30 nsec for melting and resolidification to obtain a crystalline thin film.

The resulting crystalline thin film was examined regarding the crystal grain shape. It was found that a single crystal grain had grown around the above small region of about 0.6 μm diameter as the center to a size of about 1.3 μm diameter. The surrounding portion was filled randomly with various sizes of fine crystal grains of an average diameter of about 50 nm.

In the starting thin film of this Example, the state of the interface between the thin film and the underlying substrate is different at the small region of about 0.6 μm diameter from that in the other region. This difference differentiated the state between the continuously placed regions to form "small region 1" of about 0.6 μm diameter shown in FIGS. 1A to 1H. The change of the interface state by energy beam irradiation enhanced the free-energy barrier to nucleation of crystallite in the solid-phase crystallization of the amorphous silicon thin film. As the result, in the solid-phase crystallization before melting of the starting thin film, the crystal nucleus was formed in the solid phase preferentially in the small region of about 0.6 μm diameter, and the crystal grain grew to the outside of the small region. Thereafter, with temperature rise of the thin film, at the region other than the small region, fine crystal grains were formed at a high nucleation rate. In the process of melting, the large crystal grains formed in the solid-phase crystallization in the small region of about 0.6 μm diameter were melted incompletely, whereas the fine crystal grains having formed in a high density outside the small region were completely melted.

As described above, in this example, the starting thin film was an amorphous thin film, and the state of the interface between the thin film and the substrate changed between the regions. Therefore, in melting-resolidification of the starting thin film, the height of free-energy barrier to crystallite nucleation in the solid phase crystallization before the melting varied with the region. Thereby, the size distribution of number concentration of the remaining unmelted crystal grains or crystalline clusters varies with the region to form a crystalline thin film constituted of crystal grains controlled in spatial location.

EXAMPLE 7

A seventh crystalline silicon thin film formed by the process shown in FIGS. 1A to 1H is described as Example 7 of the present invention.

An amorphous silicon thin film was formed in a thickness of 100 nm by vapor deposition on a substrate having an amorphous surface composed of silicon oxide. Then this thin film was doped with tin locally in a small region of about 1 μm square. This is employed as the starting thin film.

This starting thin film is irradiated with an Ar$^+$ laser beam at an energy density of about 500 mJ/cm$^2$ for 10 sec for melting and resolidification to obtain a crystalline thin film.

The resulting crystalline thin film is examined regarding the crystal grain shape. It would be found that a single crystal grain had grown around the above small region of about 1 μm square as the center to a grain size of about 2.5 μm diameter. The surrounding portion would be filled randomly with various sizes of fine crystal grains of an average diameter of about 40 nm.

In the starting thin film of this example, the concentration of impurity tin was different at the small region of about 1 μm square from that in the other region. This difference differentiated the states between the continuously placed regions to form "small region 1" of about 1 μm square shown in FIGS. 1A to 1H. The impurity like tin lowered the free-energy barrier to nucleation of crystallite in the solid-phase crystallization of the amorphous silicon thin film. As the result, in the solid-phase crystallization before the melting of the starting thin film, the crystal nucleus was formed in the solid phase preferentially in the small region of about 1 μm square, and the crystal grain grew to the outside of the small region. Thereafter, with temperature rise of the thin film, at the region other than the small region, fine crystal grains were formed at a high nucleation rate. In the process of melting, the large crystal grains formed in the solid-phase crystallization in the small region of about 1.2 μm square is melted incompletely, whereas the fine crystal grains having formed in a high density outside the small region are completely melted.

As described above, in this example, the starting thin film is an amorphous thin film containing an impurity, and the concentration of the impurity is changed between the regions. Therefore, in the solid-phase crystallization before the melting in the melting-resolidification process of the starting thin film, the height of free-energy barrier to crystallite nucleation varies with the region. Thereby, the size distribution of number concentration of the remaining unmelted crystal grains or crystalline clusters varies with the region to form a crystalline thin film constituted of crystal grains controlled in spatial location.

EXAMPLE 8

A crystalline silicon-germanium thin film formed by the process shown in FIGS. 1A to 1H is described as Example 8 of the present invention.

An amorphous silicon-germanium thin film of a stoichiometric elemental composition is formed in a thickness of 100 nm by vapor deposition on a substrate having an amorphous surface composed of an inorganic silicon compound. To this thin film, germanium is added locally to a small region of about 2 µm diameter on the amorphous silicon-germanium thin film. This is employed as the starting thin film.

This starting thin film is irradiated with an $Ar^+$ laser beam at an energy density of about 400 $mJ/cm^2$ for 5 sec for melting-resolidification. The resulting resolidified thin film is examined regarding the crystal grain shape. It would be found that a single crystal grain had grown around the above small region of about 2 µm diameter as the center to a size of about 4 µm diameter, and the surrounding portion filled randomly with various sizes of fine crystal grains of an average diameter of about 100 nm.

In the starting thin film of this example, the elemental composition ratio in the small region of about 2 µm diameter is different from that in the other portion. This difference causes the difference in state between the continuously placed regions to form "small region 1" of about 2 µm diameter shown in FIGS. 1A to 1H. The free-energy barrier to nucleation of crystallite in the solid-phase crystallization of the amorphous silicon-germanium thin film varies with the elemental composition ratio of silicon to germanium, reaching the maximum near the stoichiometric ratio. As the result, in the solid-phase crystallization before the melting of the starting thin film, the crystal nucleus is formed in the solid phase preferentially in the small region of about 2 µm diameter, and the crystal grain grows to the outside of the small region. Thereafter, with temperature rise of the thin film, at the region outside the small region, fine crystal grains are formed at a high nucleation rate. In the process of melting, the large crystal grains formed in the solid-phase crystallization in the small region of about 2 µm diameter is melted incompletely, whereas the fine crystal grains having formed at a high density outside the small region are completely melted.

As described above, in this example, the starting thin film is an amorphous thin film having the elemental composition ratio changed with the regions. Therefore, in the solid-phase crystallization before the melting in the melting-resolidification process of the starting thin film, the height of free-energy barrier to crystallite nucleation varies with the region. Thereby, the size distribution of number concentration of the remaining unmelted crystal grains or crystalline clusters varies with the region to form a crystalline thin film constituted of crystal grains controlled in spatial location.

EXAMPLE 9

An eighth crystalline silicon thin film formed by the process shown in FIGS. 1A to 1H is described as Example 9 of the present invention.

An amorphous silicon thin film was formed in a thickness of 100 nm by vapor deposition on a substrate having an amorphous surface composed of silicon oxide. Then on the surface thereof, a palladium thin film is formed at a thickness of 5 nm locally onto the surface of a small region of about 1 µm diameter. This is employed as the starting thin film.

This starting thin film is irradiated with a YAG laser beam at an energy density of about 250 $mJ/cm^2$ for 10 sec for melting and resolidification to obtain a crystalline thin film.

The resulting crystalline thin film is examined regarding the crystal grain shape. It would be found that a single crystal grain had grown around the above small region of about 1 µm diameter as the center to a size of about 5 µm diameter, and the surrounding portion filled randomly with various sizes of fine crystal grains of an average diameter of about 40 nm.

In the starting thin film of this example, palladium is adsorbed on the surface in the small region of about 1 µm diameter, and not in the other region. This difference in the surface adsorbate differentiates the states between the continuously placed regions to form "small region 1" of about 1 µm diameter shown in FIGS. 1A to 1H. The adsorption of metal atoms like palladium and nickel on the thin film surface lowers the free-energy barrier to nucleation of crystallite in the solid-phase crystallization of the amorphous silicon thin film. As the result, in the solid-phase crystallization before the melting of the starting thin film, the crystal nucleus is formed in the solid phase preferentially in the small region of about 1 µm diameter, and the crystal grain grows to the outside of the small region. Thereafter, with temperature rise of the thin film, in the region outside the small region, fine crystal grains are formed at a high nucleation rate. In the process of melting, the large crystal grains formed in the solid-phase crystallization in the small region of about 1 µm diameter is melted incompletely, whereas the region outside the small region, constituted of high density fine crystal grains, is completely melted.

As described above, in this example, the starting thin film is an amorphous thin film having an adsorbate in a limited region. Therefore, in the solid-phase crystallization before melting in the melting-resolidification process of the starting thin film, the height of free-energy barrier to crystallite nucleation varies with the region. Thereby, the size distribution of number concentration of the remaining unmelted crystal grains or crystalline clusters varies with the region to form a crystalline thin film constituted of crystal grains controlled in spatial location.

EXAMPLE 10

A crystalline germanium thin film formed by the process shown in FIGS. 1A to 1H is described as Example 10 of the present invention.

An amorphous germanium thin film is formed in a thickness of 200 nm by vapor deposition on a substrate having an amorphous surface composed of an inorganic silicon compound. Then on the surface thereof, an indium thin film is formed in a thickness of 10 nm locally in a small region of about 2 µm diameter. This is employed as the starting thin film. This starting thin film is irradiated with a GGG laser beam at an energy density of about 300 $mJ/cm^2$ for 1 sec for melting and resolidification to obtain a crystalline thin film.

The resulting crystalline thin film is examined regarding the crystal grain shape. It would be found that a single crystal grain had grown around the above small region of about 2 µm diameter as the center to a size of about 5 µm diameter, and the surrounding portion filled randomly with various sizes of fine crystal grains of an average diameter of about 80 nm.

In the starting thin film of this Example, indium is adsorbed on the surface in the limited small region of about 2 µm diameter, and not in the other region. This difference in the surface adsorbate differentiates the state between the continuously placed regions to form "small region 1" of about 2 μm diameter shown in FIGS. 1A to 1H. The adsorption of metal atoms like indium on the thin film surface lowers the free-energy barrier to nucleation of crystallite in the solid-phase crystallization of the amorphous germanium thin film. As the result, in the solid-phase crystallization before the melting of the starting thin film, the crystal nucleus is formed in the solid phase preferentially in the small region of about 2 μm diameter, and the crystal grain grows to the outside of the small region. Thereafter, with temperature rise of the thin film, in the region other than the small region, fine crystal grains are formed at a high nucleation rate. In the process of melting, the large crystal grains formed in the solid-phase crystallization at the small region of about 2 μm diameter is melted incompletely, whereas the region outside the small region, constituted of fine crystal grains in a high density is completely melted.

As described above, in this example, the starting thin film is an amorphous thin film having an adsorbate in a limited region. Therefore, in the solid-phase crystallization before the melting in the melting-resolidification process of the starting thin film, the height of free-energy barrier to crystallite nucleation varies with the region. Thereby, the size distribution of number concentration of the remaining unmelted crystal grains or crystalline clusters varies with the region to form a crystalline thin film constituted of crystal grains controlled in spatial location.

EXAMPLE 11

A crystalline silicon thin film formed by the process shown in FIGS. 2A to 2H is described as Example 11 of the present invention.

An amorphous silicon thin film was formed in a thickness of 100 nm by vapor deposition on a substrate having an amorphous surface composed of silicon oxide. Then this thin film was doped with tin locally in small regions of about 2 μm square. This is employed as the starting thin film.

This starting thin film is irradiated with a KrF excimer laser beam at an energy density of about 400 mJ/cm$^2$ for 40 nsec for melting and resolidification to obtain a crystalline thin film. Under the above conditions, the entire thin film is completely melted.

The resulting crystalline thin film is examined regarding the crystal grain shape. It would be found that a single crystal grain had grown respectively around the above small regions of about 2 μm square as the center to a grain size of about 4 μm diameter, and the surrounding portion filled randomly with various sizes of fine crystal grains of an average diameter of about 30 nm.

In the starting thin film of this Example, the concentration of impurity in the small region of about 2 μm square is different from that in the other region. This difference causes the difference in the states between the continuously placed regions to form "small region 1" of about 2 μm square shown in FIG. 1A. The impurity like tin lowers also the free-energy barrier to nucleation of crystallite in the molten silicon thin film, similarly as the effect in the solid-phase crystallization of the amorphous silicon thin film. As the result, in the resolidification process after complete melting of the starting thin film, the crystal nuclei are formed in the molten silicon preferentially in the small regions of about 2 μm square, and the crystal grains grow to the outside of the small regions.

As described above, in this example, the starting thin film is an amorphous thin film containing an impurity, and the concentration of the impurity is changed between the regions. Therefore, in the melting-resolidification process of the starting thin film, the height of free-energy barrier to crystallite nucleation from the molten matrix varies with the region to form a crystalline thin film constituted of crystal grains controlled in spatial location.

EXAMPLE 12

A crystalline silicon-germanium thin film formed by the process shown in FIGS. 2A to 2H is described as Example 12 of the present invention.

An amorphous silicon-germanium thin film of a stoichiometric elemental composition is formed in a thickness of 100 nm by vapor deposition on a substrate having an amorphous surface composed of an inorganic silicon compound in the same manner as in Example 8. To this thin film, silicon is added locally to small regions of about 2 μm diameter on the amorphous silicon-germanium thin film. This is employed as the starting thin film.

This starting thin film is irradiated with an XeCl excimer laser beam at an energy density of about 350 mJ/cm$^2$ for 40 nsec for melting-resolidification to obtain a crystalline thin film. Under the above conditions, the entire thin film is completely melted.

The resulting crystalline thin film is examined regarding the crystal grain shape. It would be found that a single crystal grain had grown respectively around the above small regions of about 2 μm diameter as the center to a size of about 4 μm diameter, and the surrounding portion filled randomly with various sizes of fine crystal grains of an average diameter of about 60 nm.

In the starting thin film of this example, the elemental composition ratio in the small region of about 2 μm diameter is different from that in the other portion. This difference causes the difference in the states of the continuously placed regions to form "small region 1" of about 2 μm diameter shown in FIG. 2A. The free-energy barrier to nucleation of crystallite in the solidification of the molten silicon-germanium thin film varies with the elemental composition ratio of silicon to germanium, reaching the maximum near the stoichiometric ratio, as well as nucleation in the solid-phase crystallization. As the result, the crystal nuclei are formed, in the resolidification process after the complete melting, preferentially in the small region of about 2 μm diameter, and the crystal grain grows larger to the outside of the small region.

As described above, in this example, the starting thin film is an amorphous thin film having elemental composition ratio changed with the regions. Therefore, in the melting-resolidification process of the starting thin film, the height of free-energy barrier to crystallite nucleation from the molten matrix varies with the region. Thereby, the crystalline thin film is formed which is constituted of crystal grains controlled in spatial location.

EXAMPLE 13

A crystalline silicon thin film formed by the process shown in FIGS. 3A to 3H is described as Example 13 of the present invention.

A starting thin film was prepared, and melted and resolidified in the same manner as in Example 1 to obtain a crystalline silicon thin film except that the "small region 1" was made larger in size to about 1.5 μm diameter.

The obtained crystalline thin film was observed regarding the shape of the crystal grain constituting the thin film. It was found that two single crystal grains of about 1.5 μm diameter had grown respectively around the small region of about 1.5 μm diameter, and the surrounding portion was filled randomly with various sizes of fine crystal grains of an average diameter of about 50 nm.

In this example, the small region 1" was enlarged to about 1.5 μm in diameter to increase the possibility of remaining of unmelted crystal grains or crystalline clusters therein in the melting process of the thin film in proportion to the volume increase of "small region 1". Thereby plural crystal grains grew in the small region of about 1.5 μm diameter.

The spatial location of the crystal grains constituting the crystalline thin film was controlled in this example in the same manner as in Example 1. Incidentally, the increase and control of the number of the crystal grains growing at "small region 1" can be conducted as in Examples 2 to 12. The control can also be conducted not only by the volume of "small region 1" but also by the concentration of the crystal grains or crystalline clusters, and free-energy barrier to crystallite nucleation in the "small region 1" or the melting point, and the heating conditions.

EXAMPLE 14

A crystalline silicon thin film formed by the process shown in FIGS. 4A to 4H is described as Example 14 of the present invention.

A starting thin film was prepared, and was melted and resolidified in the same manner as in Example 1 to obtain a crystalline thin film except that two "small regions 1" of about 1 μm of FIG. 1A were provided at a distance of 10 μm.

The obtained crystalline thin film was observed regarding the shape of the crystal grains constituting the crystalline thin film. It was found that a single crystal grain of about 2 μm diameter grew respectively at the two small regions of about 1 μm diameter, and the surrounding portion including the region of about 8 μm in length between the crystal grains was filled randomly with various sizes of fine crystal grains of an average diameter of about 50 nm.

The spatial location of the crystal grains constituting the crystalline thin film in this example was controlled in the same manner as in Example 1. Incidentally, the melting-resolidification process employing plural "small region 1" can be conducted as in Examples 2 to 12.

EXAMPLE 15

A crystalline silicon thin film formed by the process shown in FIGS. 5A to 5H is described as Example 15 of the present invention.

A starting thin film was prepared, and was melted and resolidified in the same manner as in Example 14 to obtain a crystalline silicon thin film except that the distance between the two "small regions 1" was reduced to about 2 μm. The obtained crystalline thin film was observed regarding the shape of the crystal grains constituting the crystalline thin film produced by melting-resolidification. It was found that a single crystal grain of about 2 μm diameter grew respectively in the two small regions of about 1 μm diameter, and the two crystal grains came to be in contact with each other at the growth fronts to form a grain boundary. The surrounding portion was filled randomly with various sizes of fine crystal grains of an average diameter of about 50 nm.

The spatial location of the crystal grains constituting the crystalline thin film in this Example is controlled in the same manner as in Example 1. Incidentally, the increase and control of the number of the crystal grain growing in "small region 1" can be conducted as in Examples 2 to 12. The melting-resolidification with plural "small regions 1" provided at a short distance as in this Example can be conducted as in Examples 2 to 12.

EXAMPLE 16

A crystalline silicon thin film formed by the process shown in FIGS. 6A to 6H is described as Example 16 of the present invention.

A starting thin film was prepared, and was melted and resolidified in the same manner as in Example 14 to obtain a crystalline silicon thin film except that the same "small regions 1" of about 1 μm diameter as in FIG. 1A were formed in plurality periodically at intervals of 2 μm in a square lattice pattern.

The obtained crystalline thin film was observed regarding the shape of the crystal grains constituting the crystalline thin film. It was found that a single crystal grain had grown respectively in an average diameter of about 2 μm at the lattice points of the square lattice of 2 μm intervals, and the crystal grains came to be in contact with each other at the growth fronts to form grain boundaries. The thin film was filled with the locationally controlled crystal grains without formation of a random fine crystal grain region.

The spatial location of the crystal grains constituting the crystalline thin film in this Example is controlled in the same manner as in Example 1. The melting-resolidification by employing plural "small regions 1" can be conducted as in Examples 2 to 12.

EXAMPLE 17

A crystalline silicon thin film formed by the process shown in FIGS. 7A to 7H is described as Example 17 of the present invention.

A polycrystalline silicon thin film is formed in a thickness of 10 nm by vapor deposition on a substrate having an amorphous surface composed of silicon oxide. Then this polycrystalline thin film is removed by leaving small regions of about 1 μm diameter at lattice points of a square lattice of 2 μm spacings. Further thereon, an amorphous silicon thin film is formed in a thickness of 100 nm by vapor deposition. This is employed as the starting thin film. In this example, the "small regions 1" are the small regions of polycrystalline thin film of about 1 μm diameter and 10 nm thick arranged at the lattice points of square lattice of 2 μm spacings covered with the flat amorphous silicon thin film.

This starting thin film is irradiated with a KrF excimer laser beam at an energy density of about 310 mJ/cm$^2$ for 30 nsec for melting and resolidification to obtain a crystalline thin film.

The resulting crystalline thin film is examined regarding the shape of the constituting crystal grains. It would be found that a single crystal grain of about 2 μm in average diameter had grown at the respective lattice points of the square lattice of 2 μm spacings, and the crystal grains come in contact with each other at the growth fronts to form a grain boundary. The thin film is filled with the locationally controlled crystal grains without formation of a random fine crystal grain region.

As described above, in this example, the starting thin film has polycrystalline regions and amorphous region. Therefore, in the melting-resolidification process of the starting thin film, the size distribution of number concentration of the remaining unmelted crystal grains or crystalline clusters varies with the regions to form a crystalline thin film constituted of crystal grains controlled in spatial location.

The melting-resolidification by employing three-dimensional "small regions 1" can be applied similarly to the crystalline thin films of Examples 2 to 12.

EXAMPLE 18

A crystalline silicon thin film formed by the process shown in FIGS. 8A to 8H is described as Example 18 of the present invention.

A starting thin film which was the same as the one in Example 1 was formed on a substrate having an amorphous surface composed of silicon oxide. Then a most of this polycrystalline thin film is removed, retaining a small region of about 10 μm diameter including a small region of about 1 μm diameter corresponding to "small region 1" in FIG. 1. This is employed as the starting thin film in this example.

This starting thin film is irradiated with an KrF excimer laser beam at an energy density of about 240 mJ/cm² for 30 nsec for melting and resolidification to obtain a crystalline thin film.

The resulting crystalline thin film is examined regarding the shape of the constituting crystal grains. It would be found that a single crystal grain of about 3 μm diameter had grown around the small region of about 1 μm diameter as the center. Except for the portion of the single crystal grain having grown from the small region of about 1 μm diameter, the thin film of 10 μm diameter remaining on the substrate would be filled randomly with various sizes of fine crystal grains of an average diameter of about 50 nm.

The spatial location of the crystal grain constituting the crystalline thin film in this Example example is controlled in the same manner as in Example 1. The melting-resolidification process by utilizing a starting thin film formed on a limited area of the substrate as in this example can be applied similarly to the crystalline thin films of Examples 2 to 17.

EXAMPLE 19

A crystalline silicon thin film formed by the process shown in FIGS. 9A to 9H is described as Example 19 of the present invention.

The crystalline thin film is obtained by melting-resolidification in the same manner as in Example 18 except that the thin film is removed by retaining a region of about 4 μm square including a small region of about 1 μm diameter as "small region 1".

The resulting crystalline thin film is examined regarding the shape of the constituting crystal grains. It would be found that a single crystal grain constitutes the entire area of the thin film of 4 μm square, and there is no crystal boundary.

The spatial location of the crystal grain constituting the crystalline thin film is controlled in the same manner as in Example 1. The melting-resolidification for forming a single crystal grain as in this example can be applied also to the crystalline thin films of Examples 2 to 17.

EXAMPLE 20

A magnetic recording element having a constitution shown in FIG. 10, and a device employing the element are described as Example 19 of the present invention.

A cobalt-chromium thin film of 50 nm thick is deposited by sputtering on a glass disk substrate which has been surface-treated. Chromium is applied as a dopant to regions of about 0.1 mm square at region intervals of 2 mm on concentric circles of circle intervals of 2 mm having a center common to the disk. This is employed as the starting thin film. The small regions doped with chromium correspond to "small region 1" in FIG. 10.

This starting thin film is irradiated with a pulse light beam having light emission wavelength maximum in an infrared region to form crystalline thin films by melting-resolidification. Thereby, crystal grains grow in a partial arc shape around the regions of about 0.1 mm square doped with chromium.

A hard disk device is built with this disk as the recording medium in which the respective crystal grains in the partial arc shape constitute a physical sector. With this hard disk device, the error rate is decreased by half in comparison with the hard disk device of the same configuration employing a disk not doped locally with chromium.

In this example, the regions doped with chromium correspond to the small regions 1, the partial arc-shaped crystal grain corresponds to crystal grain 6, and the magnetic pick-up corresponds to active small region 10 in FIG. 10.

The starting thin film in this example is an amorphous thin film in which the elemental composition ratio varies with the regions. Therefore, in melting-resolidification of the starting thin film, the free-energy barrier to crystallite nucleation during solidification from the molten matrix is varied with the region to give a crystalline thin film constituted of crystal grains controlled in spatial location. The device of this example is built by employing a crystalline thin films constituted of elements having a special region formed by a single crystal grain.

EXAMPLE 21

A crystalline superconductive thin film having a constitution shown in FIG. 11, and a grain-boundary Josephson junction type of superconductive logic element are described as Example 21 of the present invention.

A polycrystalline thin film of a superconductive oxide material $BaPh_{0.7}Bi_{0.3}O_2$ is deposited in a thickness of 100 nm by sputtering on a sapphire substrate kept at 260° C. This thin film is irradiated with an energy beam from the surface except the regions of 0.25 μm square arranged at lattice points of a square lattice of 1 μm spacings in the thin film to amorphize the irradiated regions. This is employed as the starting thin film of this Example. The small regions which have not been irradiated with the energy beam constitute "small regions 1" in FIG. 11.

The starting thin film is irradiated with pulse-modified second harmonic of a YAG laser beam for melting-resolidification to form a crystalline thin film. Thereby crystal grains grow to form grain boundaries in a lattice with spacings of 2 μm. This thin film is confirmed to have superconducting transition at 9 K from measurement of temperature dependency of volume resistivity of the thin film. Further, formation of a tunnel-type of Josephson junction is confirmed at the grain boundaries from the current-voltage characteristics.

This thin film is patterned to leave the 10 μm square island regions by conventional photolithography to connect electrode terminals composed of polycrystalline $BaPb_{0.75}Bi_{0.25}O_2$ with the square island region. Thereby a superconductive logic element is fabricated in which a pair of electrodes is connected to the two counterposed sides of the square island region as the control terminal, and another pair of electrodes is connected to the remaining sides of the square island as the gate terminal.

From the measurement of fundamental properties of this element, the maximum Josephson current is 200 μA, the voltage allowing the gate current to exceed the above current is 1.8 mV, which are preferred to those employing a simple polycrystalline $BaPh_{0.7}Bi_{0.3}O_2$ thin film as deposited. The variation of the properties of the plural elements of the same shape and size is decreased by half in comparison with those employing a simple polycrystalline $BaPh_{0.7}Bi_{0.3}O_2$ thin film as deposited. These advantages result from the facts that the grain boundary in the 10 µm square active region, namely the total length of the Josephson junction, is constant in any of the elements, and the serial-parallel connection of the crystal grains is constant owing to the junction positions arranged at the square lattice. Thus the effects of the crystalline thin film and the elements of the present invention are obvious.

In this example, the regions not irradiated with the energy beam form small regions 1 in FIG. 11, and the 10 µm square island region corresponds to active small region 10.

As described above, in this example, the starting crystalline thin film has amorphous regions and polycrystalline regions. Therefore, in the melting-resolidification process of the starting thin film, the size distribution of number concentration of the remaining unmelted crystal grains varies with the region to form a crystalline thin film constituted of crystal grains controlled in spatial location. The present example also shows formation of an element employing the crystal grains having controlled spatial location.

EXAMPLE 22

A MOS type TFT having a construction shown in FIG. 12 is described as Example 22 of the present invention.

A single silicon crystal grain of 2 µm square was formed on a glass substrate having on the surface a silicon nitride film made of silicon oxide and oxide film thereon using the process described in Example 19. Thereon a gate insulation film made of silicon oxide and a gate electrode film were deposited using a conventional low temperature process for silicon thin film transistors fabrication. The gate electrode film layer was removed except for the region of 1 µm width at the central portion of the single crystal grain. The other portion was doped with boron by a self-alignment method employing the remaining gate electrode film as the mask to form a gate region, a source region, and a drain region. Thereby, the entire area of the gate region was included in the single crystal grain. Thereon, a passivation layer formed by the insulation film was deposited, and openings were provided through the passivation layer on the respective regions. Finally, aluminum wiring layer was deposited and patterned to form a gate electrode, source electrode and a drain electrode to obtain a MOS type TFT.

From measurement of the electrical characteristics, the resulting MOS type TFT of the present invention shows more than twice higher mobility than the conventional elements formed by the same process in the same element shape on a random polycrystalline thin film without "small region 1". As to the variation of the characteristics, the variation of the mobility is reduced by half, and that of the threshold voltage is lowered by a factor of about ¼.

In this example, the spatial location of the crystal grain constituting the crystalline thin film was controlled in the same manner as in Example 19. This example shows a constitution of the element having an active region in a single crystal grain in a crystalline thin film.

EXAMPLE 23

A MOS type TFT having a construction shown in FIG. 13 is described as Example 23 of the present invention.

A crystalline thin film is obtained by melting-resolidification according to the process described in Example 18 employing a starting rectangle thin film of 3 µm 10 µm having a "small region 1" of about 1 µm diameter. The resulting crystalline thin film has a single crystal grain of about 3 µm long in the length direction of the rectangle at the center of the rectangle of 3 µm×10 µm, and the other region is filled with fine crystal grains of various sizes of an average diameter of about 50 nm.

On the above crystalline thin film, a gate insulation film composed of silicon oxide and a gate electrode film are deposited using a conventional silicon TFT low-temperature formation process, and the gate electrode film layer is partly removed except for the portion 1 µm wide including "small region 1" in the center of the single crystal grain of about 3 µm long in the breadth direction. The other portion is doped with boron by a self-alignment method employing the remaining gate electrode film as the mask to form a gate region, a source region, and a drain region. Thereby, the entire area of the gate region is included in the single crystal grain of about 3 µm long in the length direction of the entire area, whereas the source region and the drain region spread over a part of the single crystal grain of about 3 µm long in the length direction and the fine crystalline region of the average diameter of about 50 nm. Thereon, a passivation layer of the insulation film is deposited. An opening is provided on each of the regions through the passivation layer. The openings on the source region and the drain region are limited to extend about 3 µm from the end of the length direction of the rectangular crystalline thin film. Finally, an aluminum wiring layer is deposited and patterned to form a gate electrode, a source electrode and a drain electrode to obtain a MOS type TFT. Thereby the source electrode and the drain electrode are connected only to the fine crystal grain region of average diameter of about 50 nm.

From measurement of the electrical characteristics, the resulting MOS type TFT of the present invention shows more than twice higher mobility than the conventional elements formed by the same process and the same element shape on a random polycrystalline thin film without "small region 1". As to the variation of the characteristics, the variation of the mobility is reduced by half, and that of the threshold voltage is lowered remarkably by a factor of about ¼. The MOS type TFT of this example has the performance characteristics comparable with that of the element of Example 22, even though the element is not entirely included in the single crystal grain. This means that the channel region as the active region which controls the performance is formed inside the single crystal grain.

In this example, the spatial location of the crystal grain constituting the crystalline thin film is controlled in the same manner as in Example 19.

EXAMPLE 24

A TFT integrated circuit having a construction shown in FIG. 14 is described as Example 24 of the present invention.

Two elements of the MOS type TFTs shown in Example 22 are formed on one and the same substrate, and the electrodes are connected as follows. The two elements are placed adjacently at a center-to-center distance of 6 µm. The drain electrode of the first TFT is connected to the gate electrode of the second TFT. This gate electrode of the second TFT is connected through a condenser element to the source electrode of the same TFT. Thereby an integrated circuit is constructed which comprises the two TFT elements and the condenser element. With this circuit, the output of the source current supplied to the second TFT source through the drain is controlled by the condenser capacity of the condenser element, whereas the storage capacity of the condenser element and the switching of the storage are controlled by the gate voltage of the first TFT. This circuit is applicable, for instance, to a circuit for pixel switching and current control of active matrix type display device.

By measurement of the basic characteristics, the circuit formed in this Example is compared with a circuit formed on a random polycrystalline thin film formed by the same process in the same circuit shape but not having the "small region 1" of the present invention. As the results, it is confirmed that the circuit can be operated faster more than three times faster in the operatable switching frequency range, and that the controllable range of the current outputted from the drain electrode of the second TFT is enlarged by a factor of about 2. The variation of the performances of the same circuits formed in plurality is decreased by about half. This means that the variation among the first TFTs and among the second TFTs and the relative property between the first TFT and second TFT in one circuit are small in comparison with the compared circuit.

In this example, the spatial location of the crystal grain constituting the crystalline thin film is controlled in the same manner as in Example 19.

EXAMPLE 25

An EL image display device having a construction shown in FIG. 15 is described as Example 25 of the present invention.

TFT integrated circuits described in Example 24 are formed as the elementary circuits at points of square lattice of spacings of 100 µm on a glass substrate. Wiring is made as below to use the unit cells in the square lattice as pixels of an image display device. First, a scanning line is provided for each lattice in one axis direction in the square lattice, and the gate electrodes are connected thereto. On the other hand, in the direction perpendicular to the scanning lines, a signal line and a source line were made for each lattice, and the first source electrode and the second source electrode of each of the elements are connected thereto. On the integrated circuits of these elementary circuits, an insulation layer is laminated. Openings are provided to bare the drain electrodes of the second TFTs of the respective elementary circuit. Next, a metal electrode is laminated, and the laminated metal electrode is separated and insulated for each of the pixels. Finally, an electroluminescence (EL) layer and an upper transparent electrode layer are laminated. Thus, an active matrix type multi-gradation EL image display device is constructed which conducts switching of the pixels and control of input current with the TFT integrated circuit described in Example 24.

In this image display device, by actuating the first TFT in correspondence with the voltage of the scanning line, an electric charge is stored in the condenser element from the source line corresponding to the current to be input to the signal line, and the current controlled by the second TFT gate voltage corresponding to the stored charge is injected through the source line to the EL-emitting layer.

The basic characteristics of the image display device of this example are measured. The image display device of this example is compared with the one produced with a random polycrystalline thin film in the same process in the same shape without providing the "small region 1" of the present invention. As the results, regarding the static characteristics, it is confirmed that the maximum brightness and the maximum contrast are improved by a factor of about 2, the gradation reproducible region is enlarged by a factor of about 1.5, and the pixel deficiency ratio and luminosity variation are reduced, respectively, by a factor of ⅓ and ½. Regarding the dynamic characteristics, it is confirmed that the maximum frame rate is improved by a factor of about 2. All of the above improvements come from the improvements of the elementary circuit characteristics and decrease of the variations as mentioned in Example 24, and from improvements in the characteristics of the thin film transistors constituting the element circuit and decrease of variation thereof. Therefore the effects are based on the formation of the active region of the thin transistor in single crystal grain.

As described above in detail, in the production of a crystalline thin film by melting-resolidification of a starting thin film, the present invention provides a method for readily controlling spatial location of crystal grains constituting the crystalline thin film by providing regions of different states coexisting continuously in the starting thin film.

The present invention provides also, in production of a crystalline thin film by melting-resolidification of a starting thin film, a method for readily controlling spatial location of crystal grains constituting the crystalline thin film by providing a small region different in state from the surrounding region in the starting thin film, and allowing growth of a prescribed number of crystal grains or crystalline clusters at the small region.

In the present invention, the regions different in state from each other can be formed in the starting thin film to control the location of the crystal grain in the crystalline thin film in the melting-resolidification process by any of the methods below: formation of regions different in size distribution of number concentration of crystal grains or crystalline clusters in the starting thin film; formation of regions in which the melting point is different in a bulk portion or surface of the crystal grains or crystalline clusters, grain boundary between adjacent grains or crystalline clusters, or the amorphous regions; formation of regions different in size distribution of number concentration of crystal grains or crystalline clusters in the base material of the starting thin film; formation of regions different in size distribution of number concentration of crystal grains constituting the polycrystalline thin film as the starting thin film; formation of an amorphous region and a polycrystalline region in the starting thin film; formation of regions different in the free-energy barrier to nucleation of crystallite in solidification from the molten phase in the melting-resolidification process; and formation of regions different in the free-energy barrier to nucleation of crystallite in solid-phase crystallization before melting of the amorphous starting thin film. Further in the present invention, the regions can be provided in the starting thin film by forming regions different in element composition ratio, impurity concentration contained, or surface adsorbate of the thin film, or different in the interfacial state between the thin film and the substrate.

The present invention provides further a crystalline thin film produced by any of the above-mentioned processes. The crystalline thin film of the present invention has improved performance characteristics with reduced variation thereof by relating spatially the controlled position of constituting crystal grain with a specified region of the element or by forming a special region within a single crystal grain controlled locationally in comparison with conventional crystalline thin film constituted of random crystal grains.

The circuit employing the aforementioned element of the present invention has improved static and dynamic characteristics with reduced variation thereof in comparison with conventional circuits employing a crystalline thin film constituted only of random crystal grains not locationally controlled.

The device of the present invention employing the element or circuit of the present invention is improved in the operational characteristics by improved operational characteristics and reduced variation of the element or circuit. Thus the present invention provides a device of high performance which cannot be realized by conventional device employing a crystalline film constituted only of random crystal grains not controlled locationally.

What is claimed is:

1. A process for producing a crystalline thin film, comprising the steps of:
   preparing a thin film having multiple amorphous regions coexisting continuously, the multiple amorphous regions differing in state from one another;
   melting the multiple amorphous regions coexisting continuously; and
   resolidifying the multiple amorphous regions to grow at least a crystal grain or crystalline cluster at a location defined by the multiple amorphous regions.

2. The process for producing a crystalline thin film according to claim 1, wherein the thin film contains at least the crystal grain or crystalline cluster, and the state that differs between the regions is characterized by size distribution of number concentration of crystal grains or crystalline clusters which will remain ummelted in said melting and resolidifying steps.

3. The process for producing a crystalline thin film according to claim 2, wherein the state that differs between the regions is further characterized by a melting point of the bulk portions or surfaces of the at least one crystal grain or crystalline cluster, or boundary between adjacent crystal grains or crystalline clusters.

4. The process for producing a crystalline thin film according to claim 2, wherein the state that differs between the regions is further characterized by a melting point of the bulk portions or surfaces of the crystal grains or crystalline clusters, or boundary between adjacent crystal grains or crystalline clusters.

5. The process for producing a crystalline thin film according to claim 2, wherein the thin film is an amorphous thin film containing at least the crystal grain or a crystalline cluster, and the state that differs between the regions is further characterized by a size distribution of number concentration of the crystal grains or crystalline clusters contained in the amorphous base material of the thin film.

6. The process for producing a crystalline thin film according to claim 2, wherein the state that differs between the regions is further characterized by the height of free-energy barriers to nucleation of crystallite in solid-phase crystallization before melting in said melting and resolidifying steps.

7. The process for producing a crystalline thin film according to claim 6, wherein the height of free-energy barriers to nucleation of crystallite is controlled by any of an element composition ratio, a contained impurity concentration, a surface adsorbate, and a state of the interface between the thin film and a substrate.

8. A process for producing a crystalline thin film, comprising the steps of:
   preparing a thin film having a predetermined amorphous region differing in state from a surrounding amorphous region;
   irradiating an energy to both of the predetermined amorphous region and the surrounding amorphous region to melt the regions; and
   cooling to resolidify the regions to grow at least a crystal grain or crystalline cluster at a location defined by the predetermined amorphous region.

9. The process for producing a crystalline thin film according to claim 8, wherein the at least one crystal grain or crystalline cluster is nucleated in the predetermined amorphous region.

10. The process for producing a crystalline thin film according to claim 8, wherein the at least one crystal grain or crystalline cluster remains unmelted in the predetermined amorphous region at the maximal melting of the thin film.

11. The process for producing a crystalline thin film according to claim 1 or 8, wherein the state that differs between the regions is characterized by a height of free-energy barrier to nucleation of crystallite in solidification from a liquid phase.

12. The process for producing a crystalline thin film according to claim 11, wherein the height of free-energy barrier to nucleation of crystallite is controlled by any of an element composition ratio, a contained impurity concentration, a surface adsorbate, and a state of the interface between the thin film and a substrate.

13. The process for producing a crystalline thin film according to claim 1 or 8, wherein the spatial location of at least a part of crystal grains having a continuous crystal structure in the crystalline thin film is controlled by controlling the spatial location of the regions differing in state in the thin film.

14. A crystalline thin film produced by the process for producing a crystalline thin film according to claim 1 or 8.

15. An element employing the crystalline thin film according to claim 14.

16. The element according to claim 15, wherein the spatial location of at least a part of the crystal grains having a continuous crystal structure in the crystalline thin film is controlled by controlling the spatial location of the regions differing in state in the thin film, and the crystal grains having the controlled location are employed as active regions.

17. The element according to claim 16, wherein the active regions are formed inside the single crystal grain in the crystalline thin film.

18. A circuit employing the element according to claim 15.

19. A device employing the circuit according to claim 18.

20. A device employing the element according to claim 15.

21. The process for producing a crystalline thin film according to claim 1, wherein the multiple amorphous regions contain a crystal grain or crystalline cluster.

22. The process for producing a crystalline thin film according to claim 8, wherein the thin film contains crystal grains or crystalline clusters, and the state that differs between the regions is characterized by size distribution of number concentration of crystal grains or crystalline clusters which will remain unmelted in said irradiating and cooling steps.

23. The process for producing a crystalline thin film according to claim 22, wherein the state that differs between the regions is further characterized by a melting point of the bulk portions or surfaces of the crystal grains or crystalline clusters, or boundary between adjacent crystal grains or crystalline clusters.

24. The process for producing a crystalline thin film according to claim 22, wherein the thin film is an amorphous thin film containing at least the crystal grain or a crystalline cluster, and the state that differs between the regions is further characterized by a size distribution of number concentration of the crystal grains or crystalline clusters contained in the amorphous base material of the thin film.

25. The process for producing a crystalline thin film according to claim 22, wherein the state that differs between the regions is further characterized by the height of free-energy barriers to nucleation of crystallite in solid-phase crystallization before melting in said irradiating and cooling steps.

26. The process for producing a crystalline thin film according to claim 25, wherein the height of free-energy barriers to nucleation of crystallite is controlled by any of an element composition ratio, a contained impurity concentration, a surface adsorbate, and a state of the interface between the thin film and a substrate.

27. The process for producing a crystalline thin film according to claim 8, wherein the predetermined amorphous region contains a crystal grain or crystalline cluster.

28. A process for producing a crystalline film, comprising the steps of:
preparing a film having a first amorphous region and a second amorphous region adjoining the first amorphous region;
melting the first and second amorphous regions; and
resolidifying the first and second amorphous regions,
wherein a concentration of a crystal grain or crystalline cluster contained in the first amorphous region is higher than that contained in the second amorphous region, and the crystal preferentially grows in the first amorphous region in said resolidifying step.

29. A process for producing a crystalline film, comprising the steps of:
preparing a film having multiple amorphous regions coexisting continuously, the multiple amorphous regions differing in amorphous state from one another;
melting the multiple amorphous regions coexisting continuously; and
solidifying the multiple amorphous regions.

30. A process for producing a crystalline film, comprising the steps of:
preparing a film having a first amorphous region differing in amorphous state from a second amorphous region adjoining the first amorphous region;
melting the first and second amorphous regions; and
solidifying the regions so that a crystal growth preferentially occurs in the first amorphous region.

31. The process for producing a crystalline film according to claim 20 or 30, wherein said differing in amorphous state means differing from each other in height of free-energy barrier to nucleation of cystallite.

* * * * *

UNITED STATES PATENT AND TRADEMARK OFFICE
CERTIFICATE OF CORRECTION

PATENT NO. : 7,115,487 B2
APPLICATION NO. : 10/156124
DATED : October 3, 2006
INVENTOR(S) : Hideya Kumomi et al.

It is certified that error appears in the above-identified patent and that said Letters Patent is hereby corrected as shown below:

ON THE TITLE PAGE, AT ITEM (56), Other Publications:
Page 1, Williamson, "Jounral" should read --Journal--.
Page 2, D. Toet, "N n" should read --Non--.
Page 2, H.J. Song, "SIO$_2$" should read --SiO$_2$--.
Page 2, H.J. Kim, "excimer" should read --Excimer--.
Page 2, R. Ishihara, "M lting" should read --Melting--.
Page 2, V.V. Gupta, "SIO$_2$" should read --SiO$_2$--.
Page 3, N. Sato, "sites on" should read --sites of--.
Page 3, Chang-Ho Oh, "Laster" should read --Laser--.
Page 3, M. Nakata, "Meth d" should read --Method--.

COLUMN 3
Line 17, "resolification" should read --resolidification--.

COLUMN 9
Line 56, "Midium" should read --Medium--.

COLUMN 11
Line 61, "W* -" should read --W* ∝--.

COLUMN 13
Line 15, ""g" " should read --"g"--.

COLUMN 22
Line 63, "0.1.5 μm" should read --1.5 μm--.

COLUMN 29
Line 5, ""small region 1" " should read --"small region 1"--.

COLUMN 31
Line 62, "Example 19" should read --Example 20--.

COLUMN 34
Line 7, "3 μm   10 μm" should read --3μm x 10μm--.

COLUMN 35
Line 11, "of" should read --of an--.

COLUMN 37
Line 33, "ummelted" should read --unmelted--.

UNITED STATES PATENT AND TRADEMARK OFFICE
CERTIFICATE OF CORRECTION

PATENT NO. : 7,115,487 B2
APPLICATION NO. : 10/156124
DATED : October 3, 2006
INVENTOR(S) : Hideya Kumomi et al.

It is certified that error appears in the above-identified patent and that said Letters Patent is hereby corrected as shown below:

COLUMN 40
Line 26, "claim 20" should read --claim 29--.
Line 28, "cystallite." should read --crystallite.--.

Signed and Sealed this

Twenty-sixth Day of June, 2007

JON W. DUDAS
*Director of the United States Patent and Trademark Office*